(12) United States Patent
Male et al.

(10) Patent No.: US 11,495,522 B2
(45) Date of Patent: Nov. 8, 2022

(54) SUSPENDED SEMICONDUCTOR DIES

(71) Applicant: TEXAS INSTRUMENTS INCORPORATED, Dallas, TX (US)

(72) Inventors: Barry Jon Male, West Granby, CT (US); Marco Corsi, Scotts Valley, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/120,941

(22) Filed: Dec. 14, 2020

(65) Prior Publication Data

US 2022/0189857 A1 Jun. 16, 2022

(51) Int. Cl.
*H01L 23/495* (2006.01)
*H01L 23/00* (2006.01)
*H01L 23/532* (2006.01)

(52) U.S. Cl.
CPC .. *H01L 23/49503* (2013.01); *H01L 23/49531* (2013.01); *H01L 23/49541* (2013.01); *H01L 23/53214* (2013.01); *H01L 24/93* (2013.01)

(58) Field of Classification Search
CPC ................................................ H01L 23/49503
USPC .......................................................... 257/676
See application file for complete search history.

(56) References Cited

U.S. PATENT DOCUMENTS

| | | | |
|---|---|---|---|
| 6,768,208 B2* | 7/2004 | Lin | ........................ H01L 25/105 257/737 |
| 9,105,649 B2* | 8/2015 | Ehrenpfordt | .......... H01L 21/563 |
| 2010/0244234 A1 | 9/2010 | Sonobe et al. | |
| 2010/0252923 A1 | 10/2010 | Watanabe et al. | |
| 2017/0330841 A1 | 11/2017 | Cook et al. | |

* cited by examiner

*Primary Examiner* — Ajay Arora
(74) *Attorney, Agent, or Firm* — Yudong Kim; Charles A. Brill; Frank D. Cimino

(57) ABSTRACT

In examples, an electronic device comprises a printed circuit board (PCB), an orifice extending through the PCB, and a semiconductor die suspended above the orifice by aluminum bond wires. The semiconductor die is vertically aligned with the orifice and the bond wires coupled to the PCB.

25 Claims, 22 Drawing Sheets

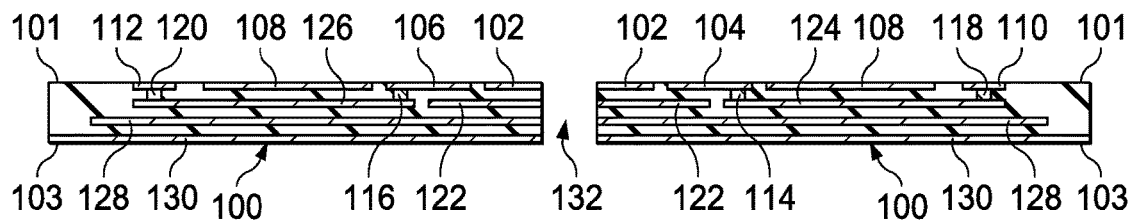
FIG. 1A1
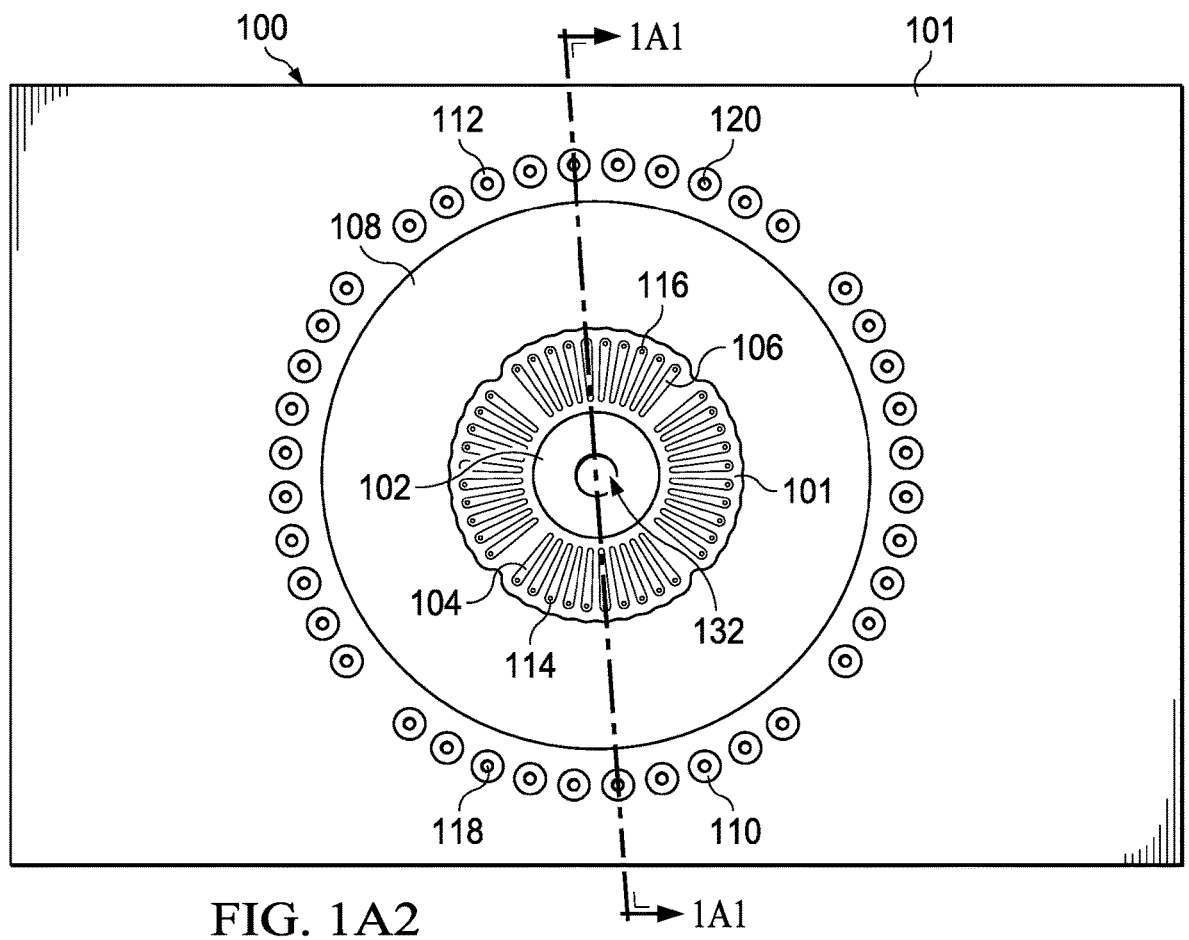
FIG. 1A2

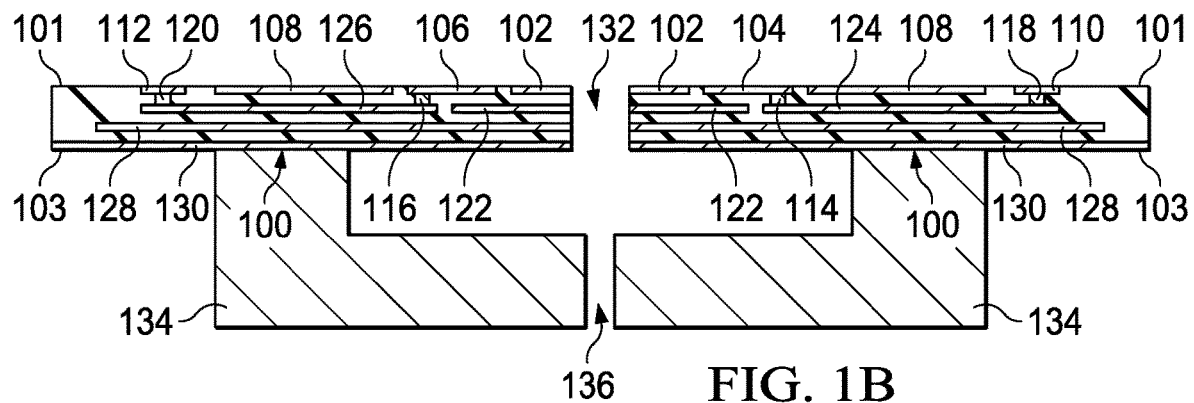
FIG. 1B
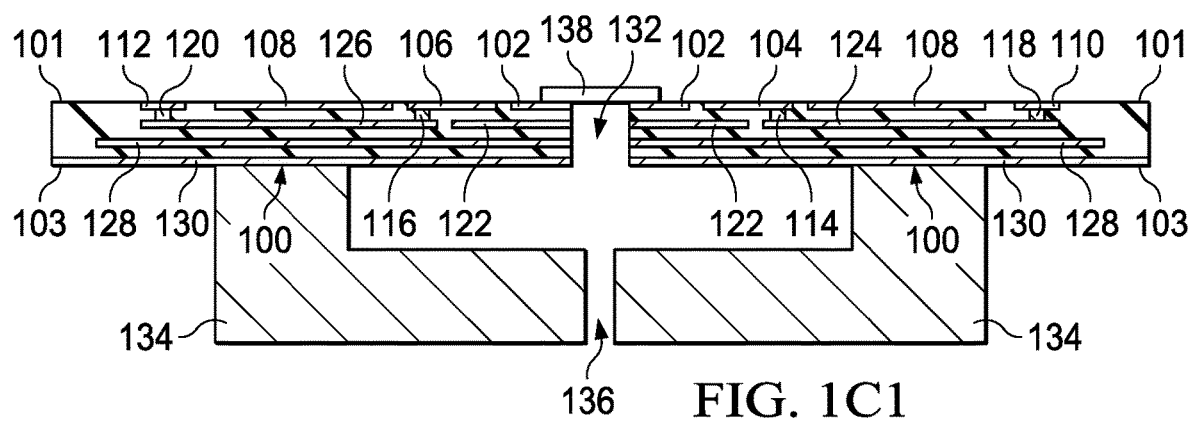
FIG. 1C1

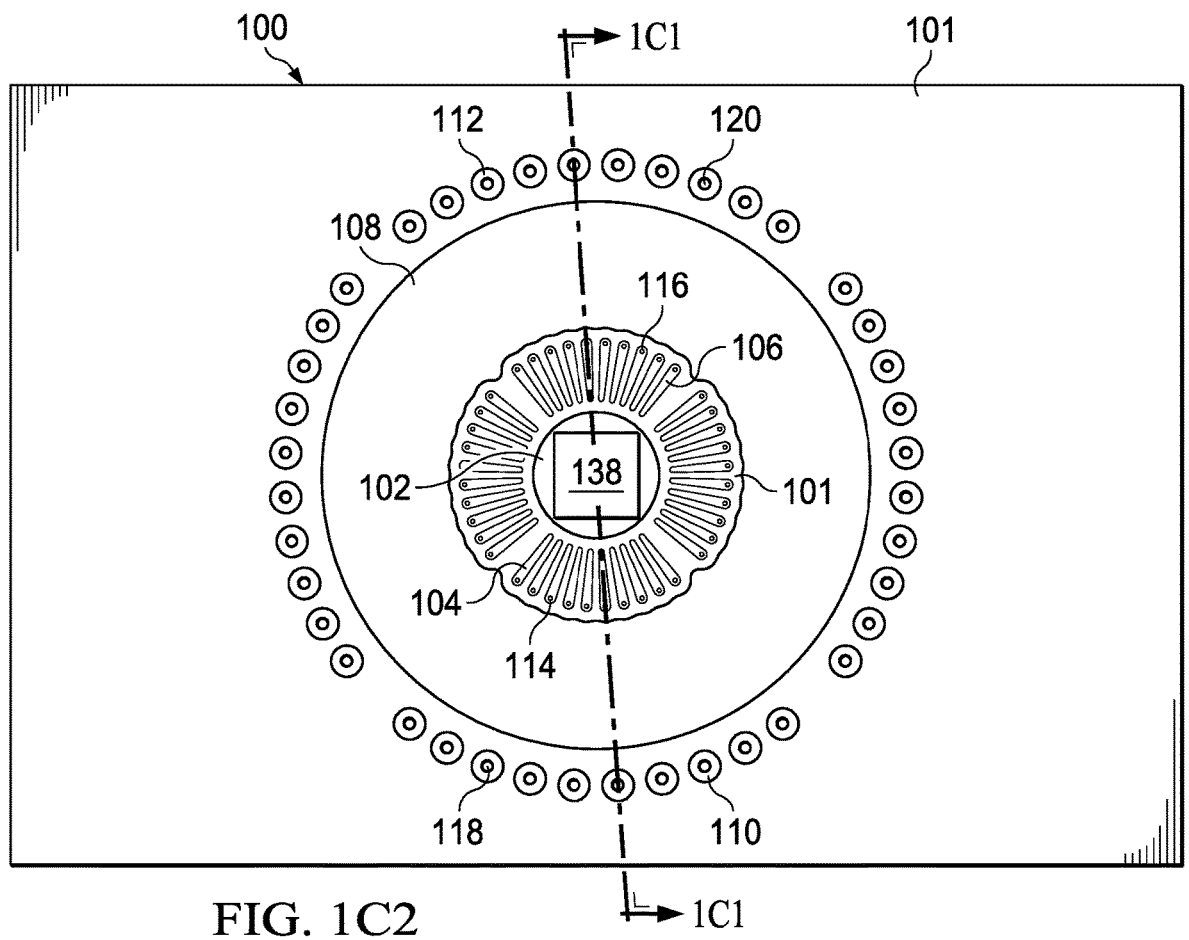
FIG. 1C2
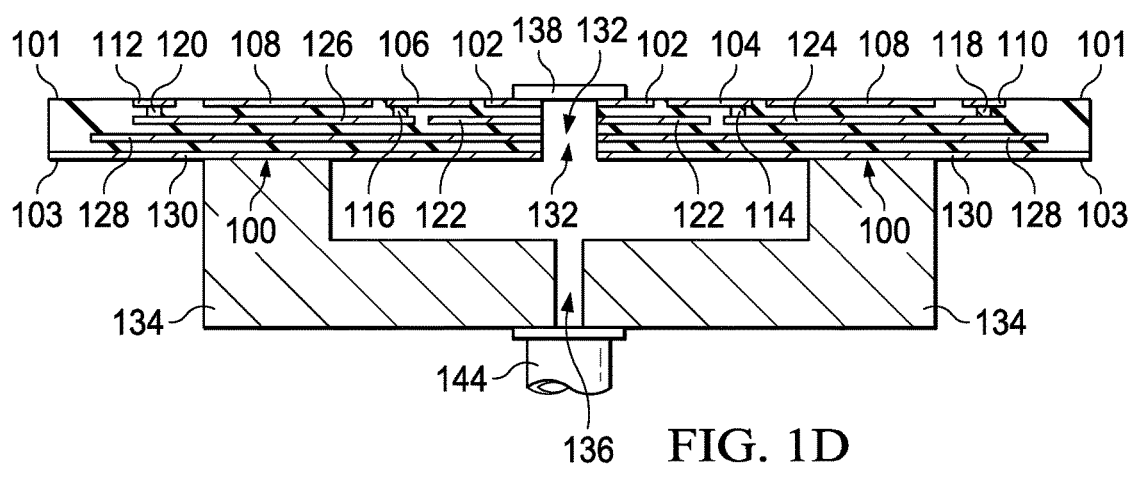
FIG. 1D

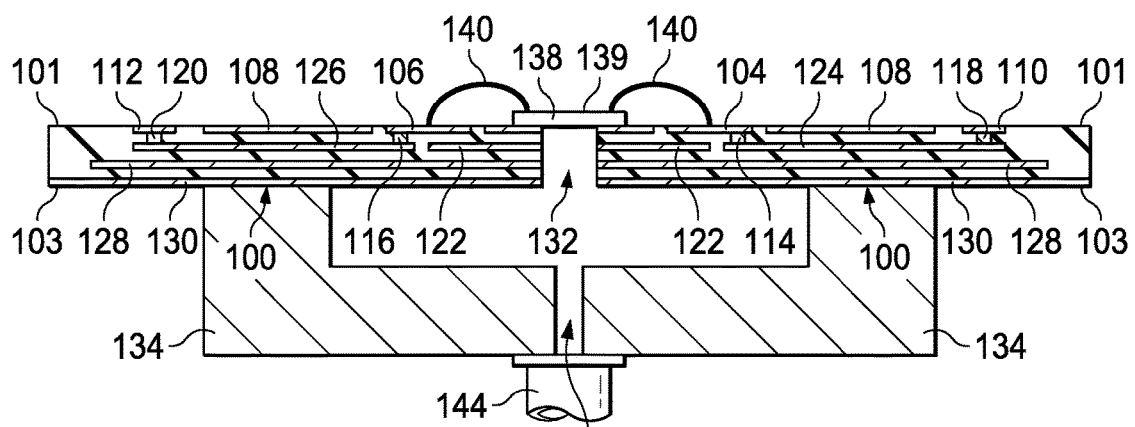
FIG. 1E1
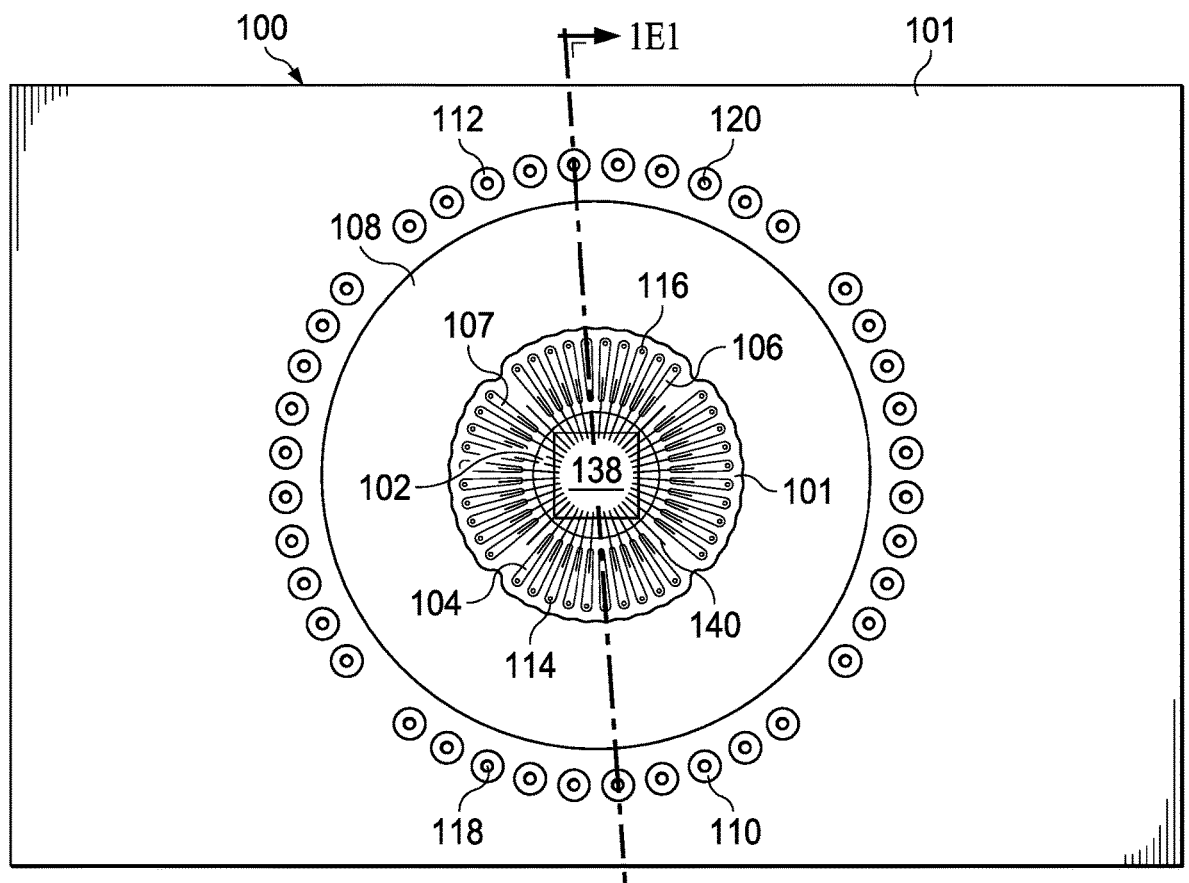
FIG. 1E2

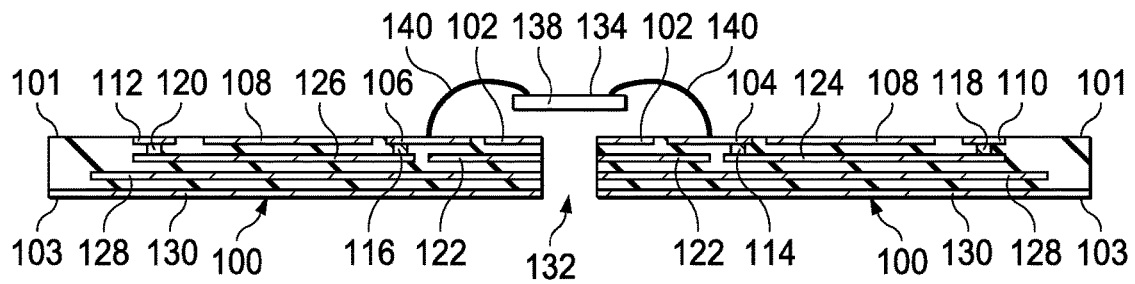
FIG. 1F1
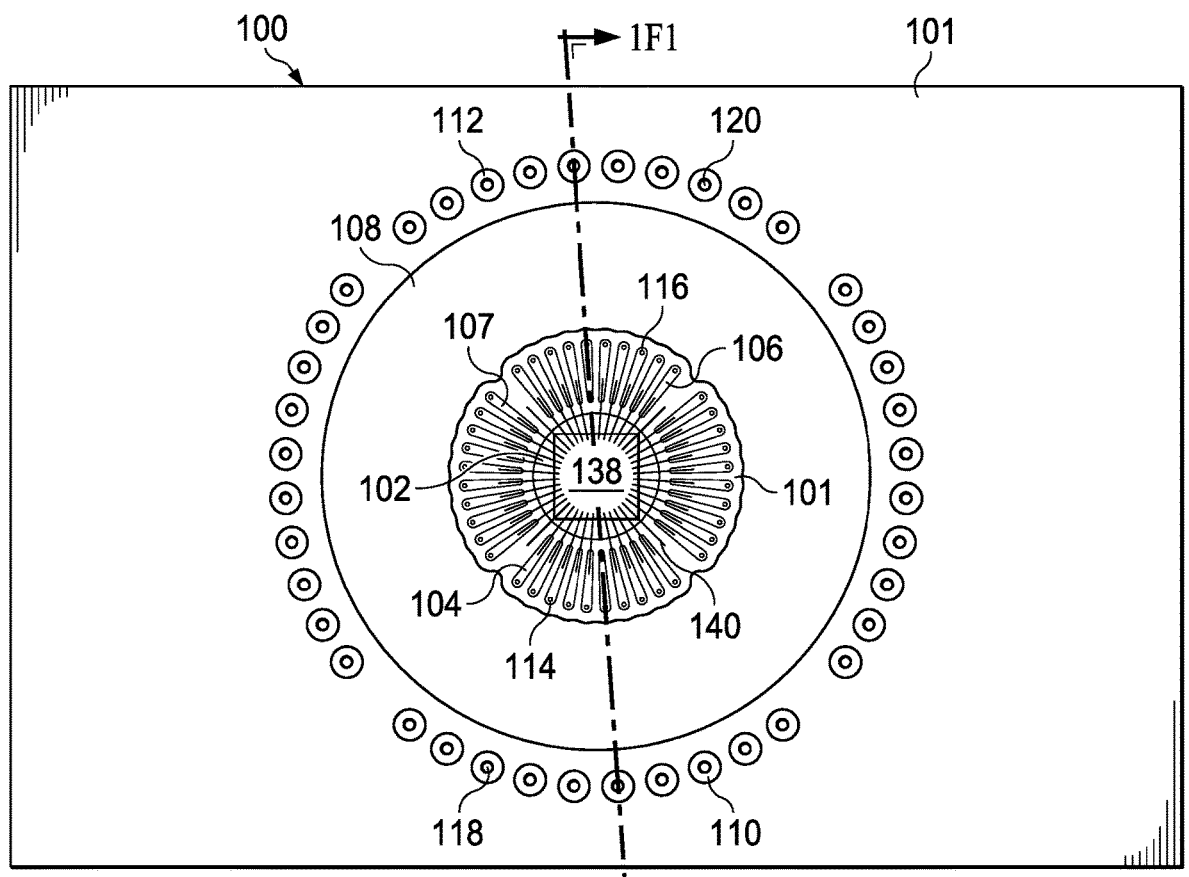
FIG. 1F2

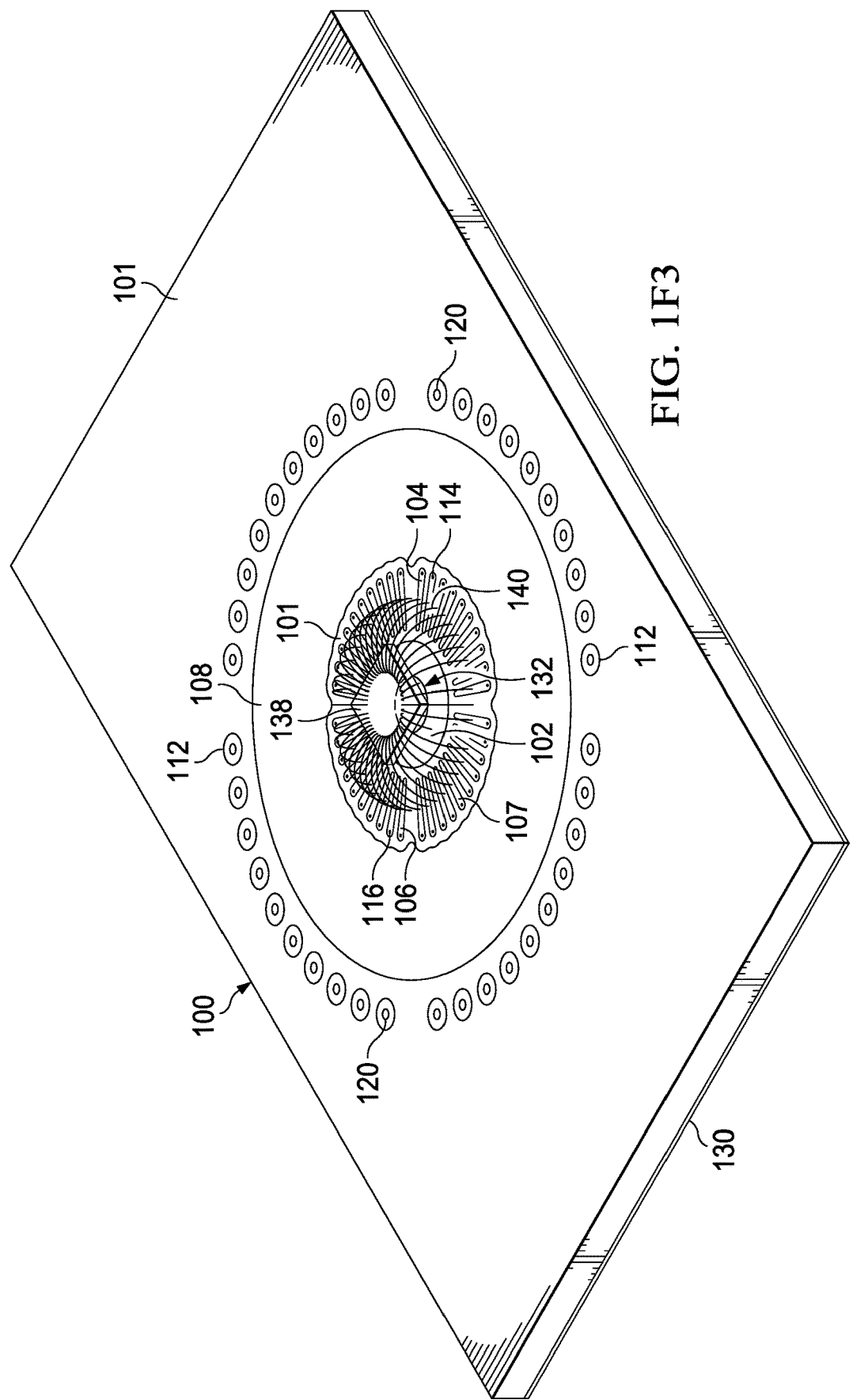
FIG. 1F3

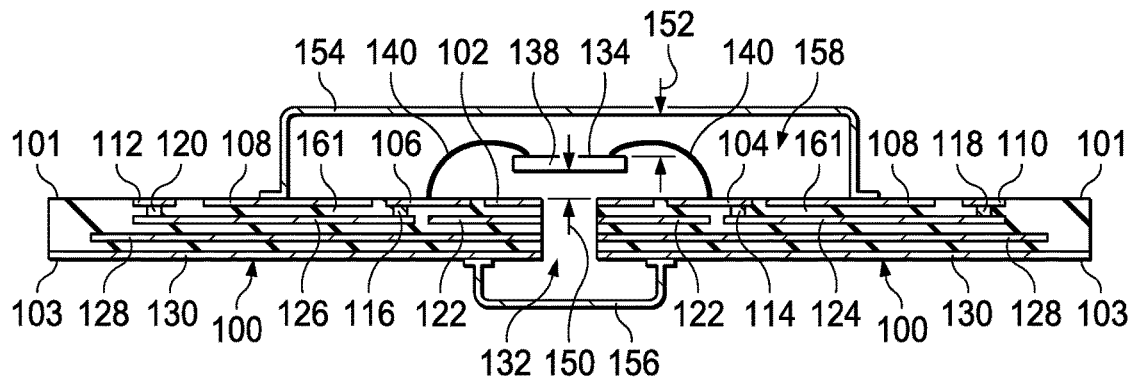
FIG. 1G1
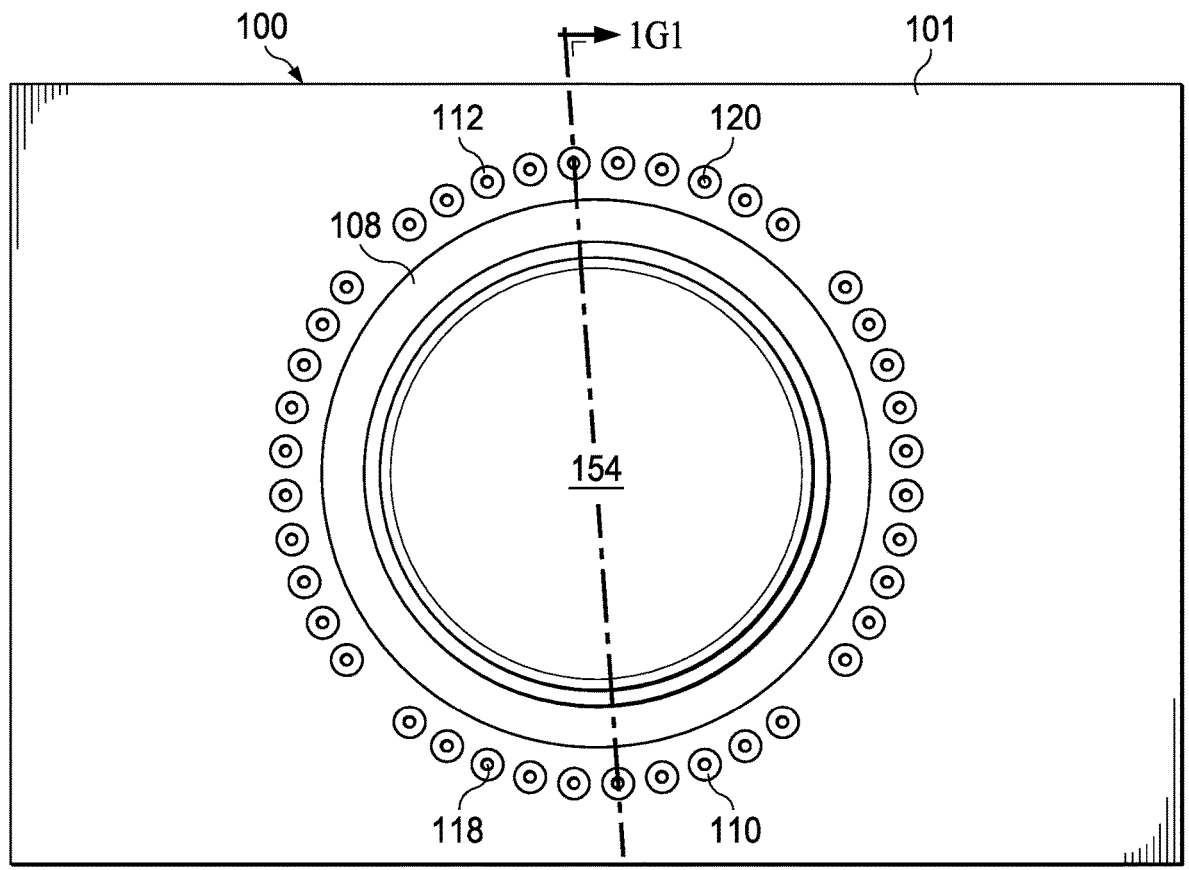
FIG. 1G2

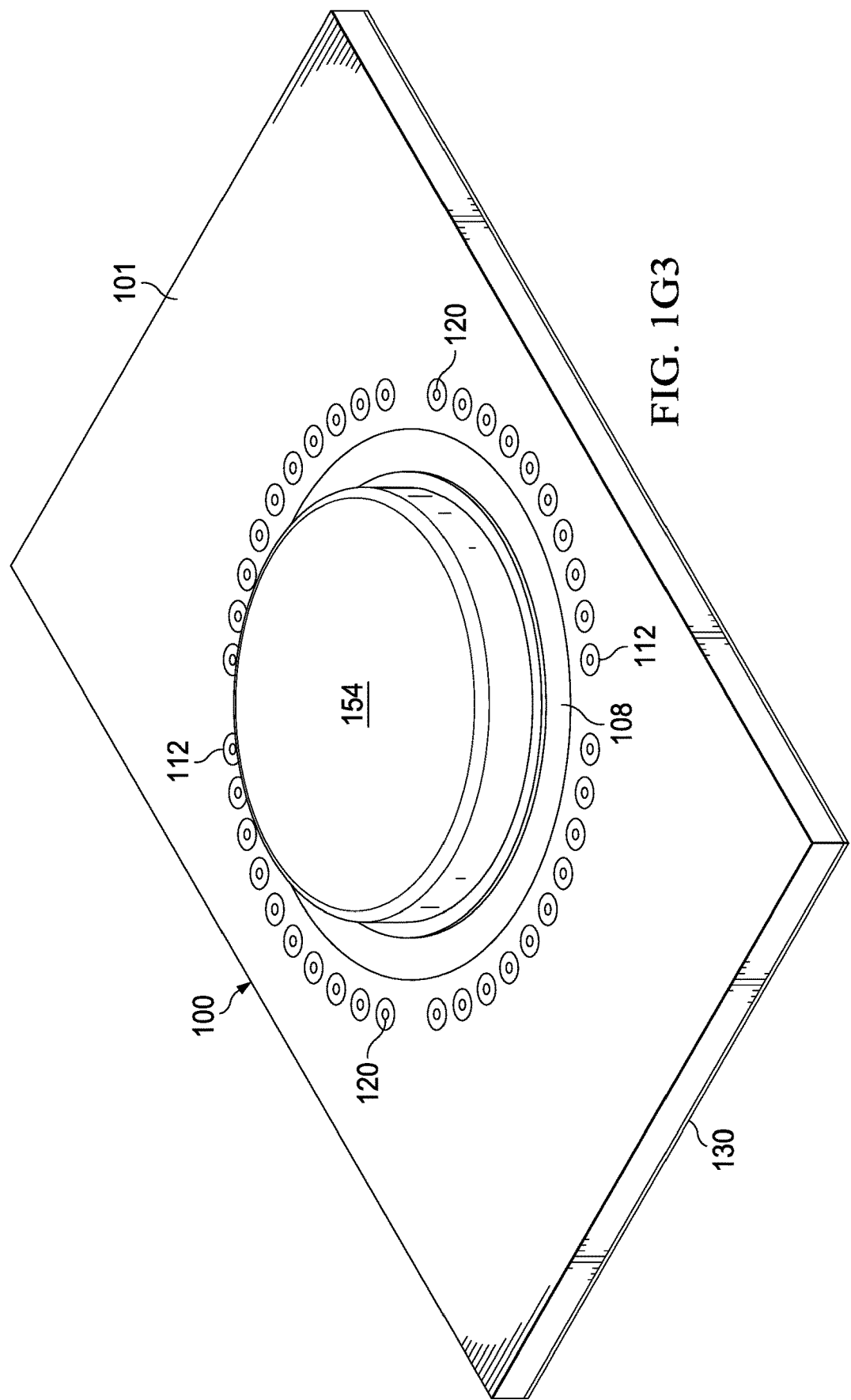
FIG. 1G3

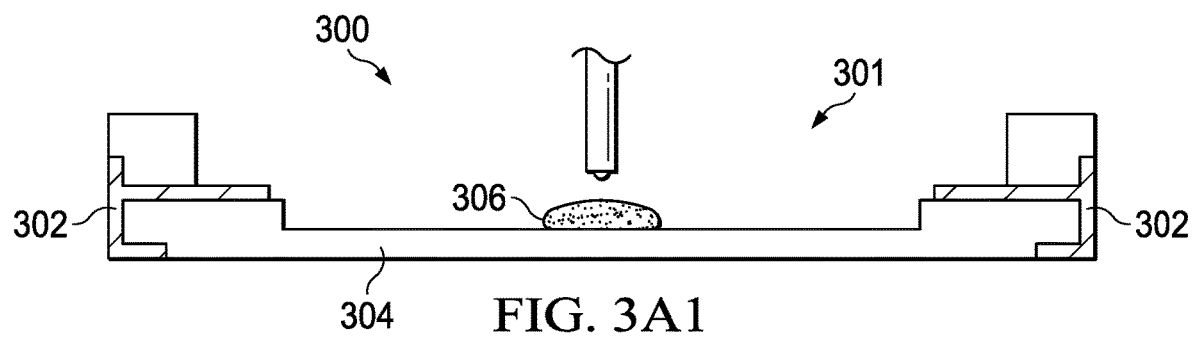
FIG. 3A1
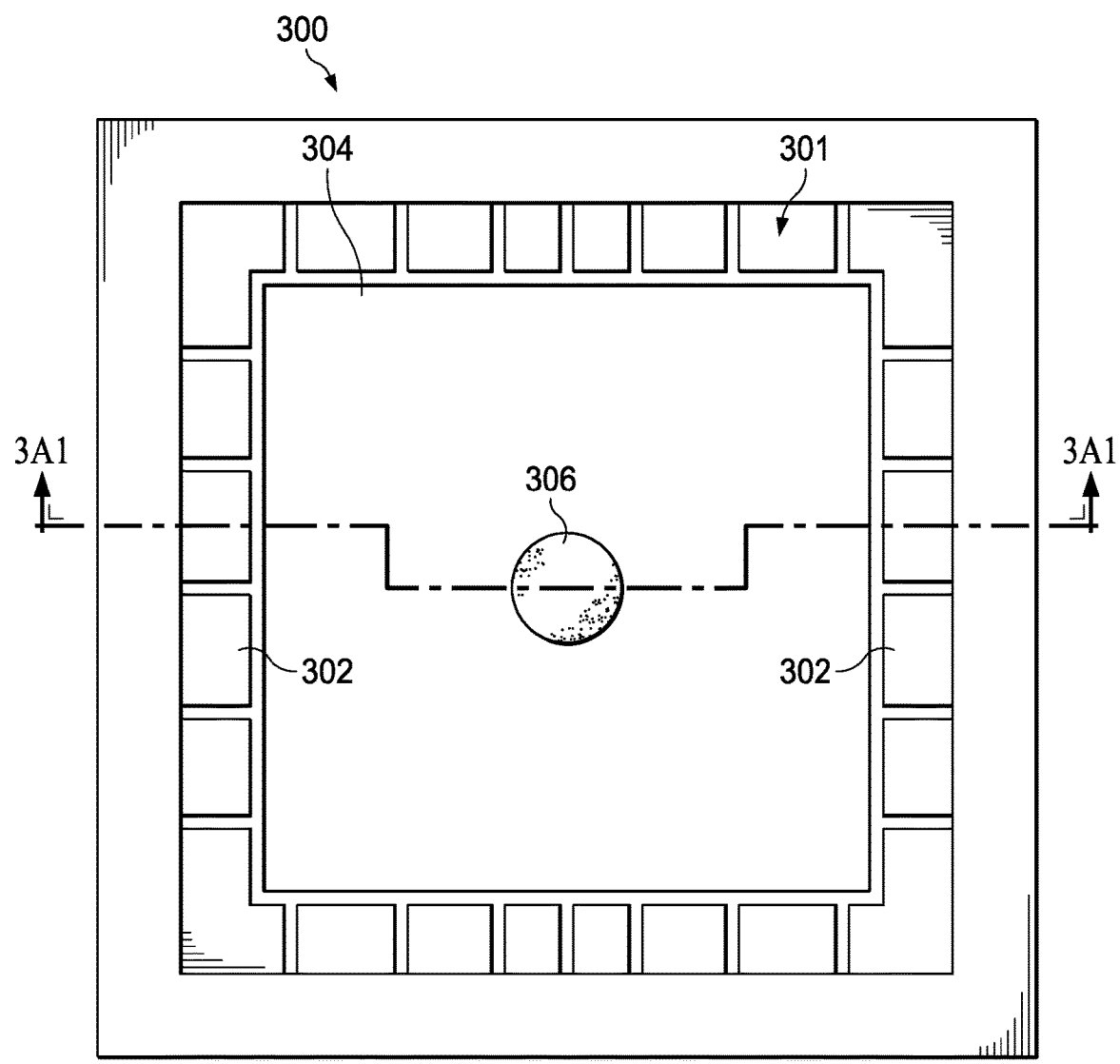
FIG. 3A2

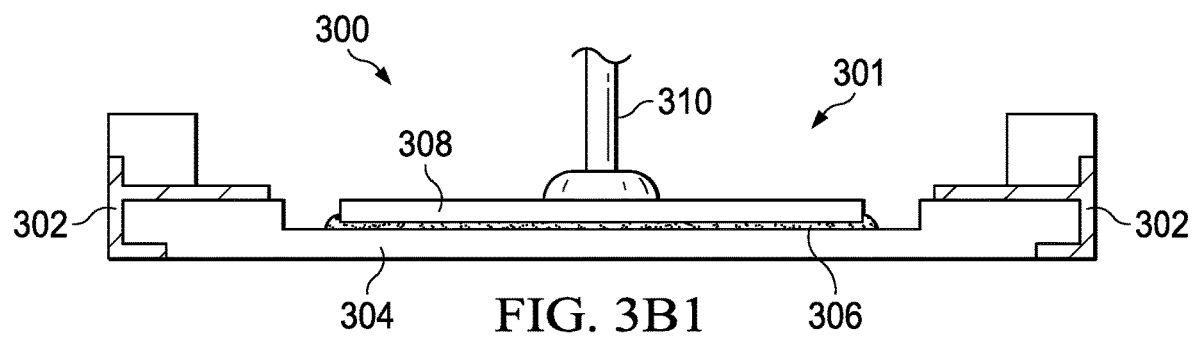
FIG. 3B1
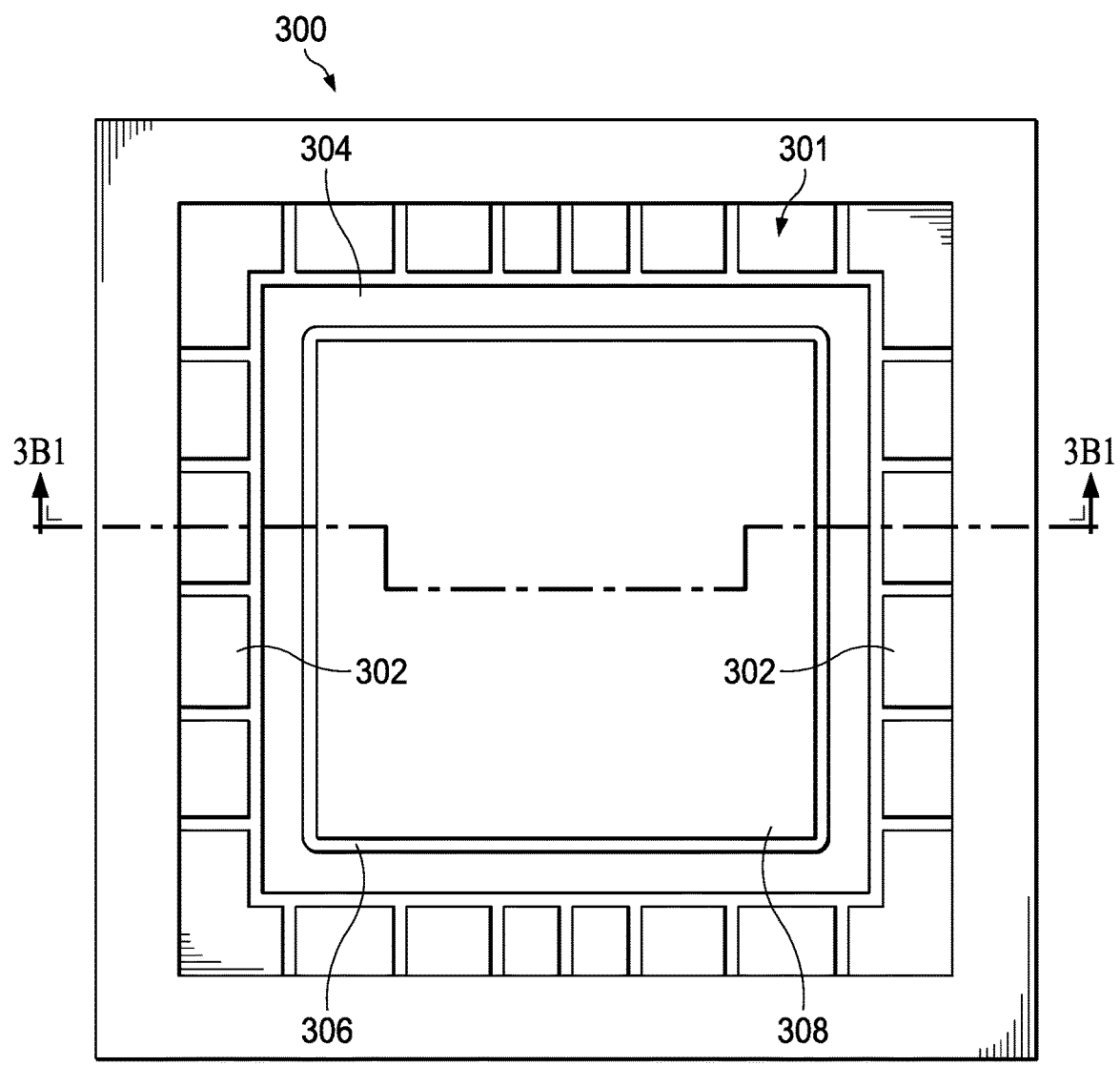
FIG. 3B2

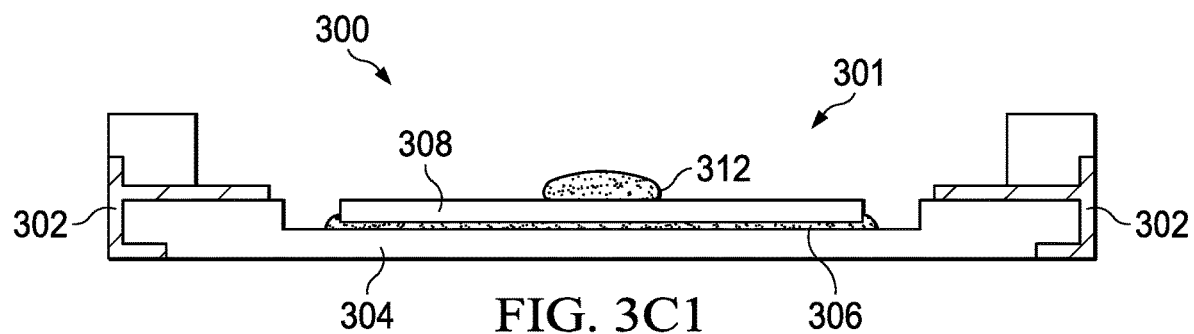
FIG. 3C1
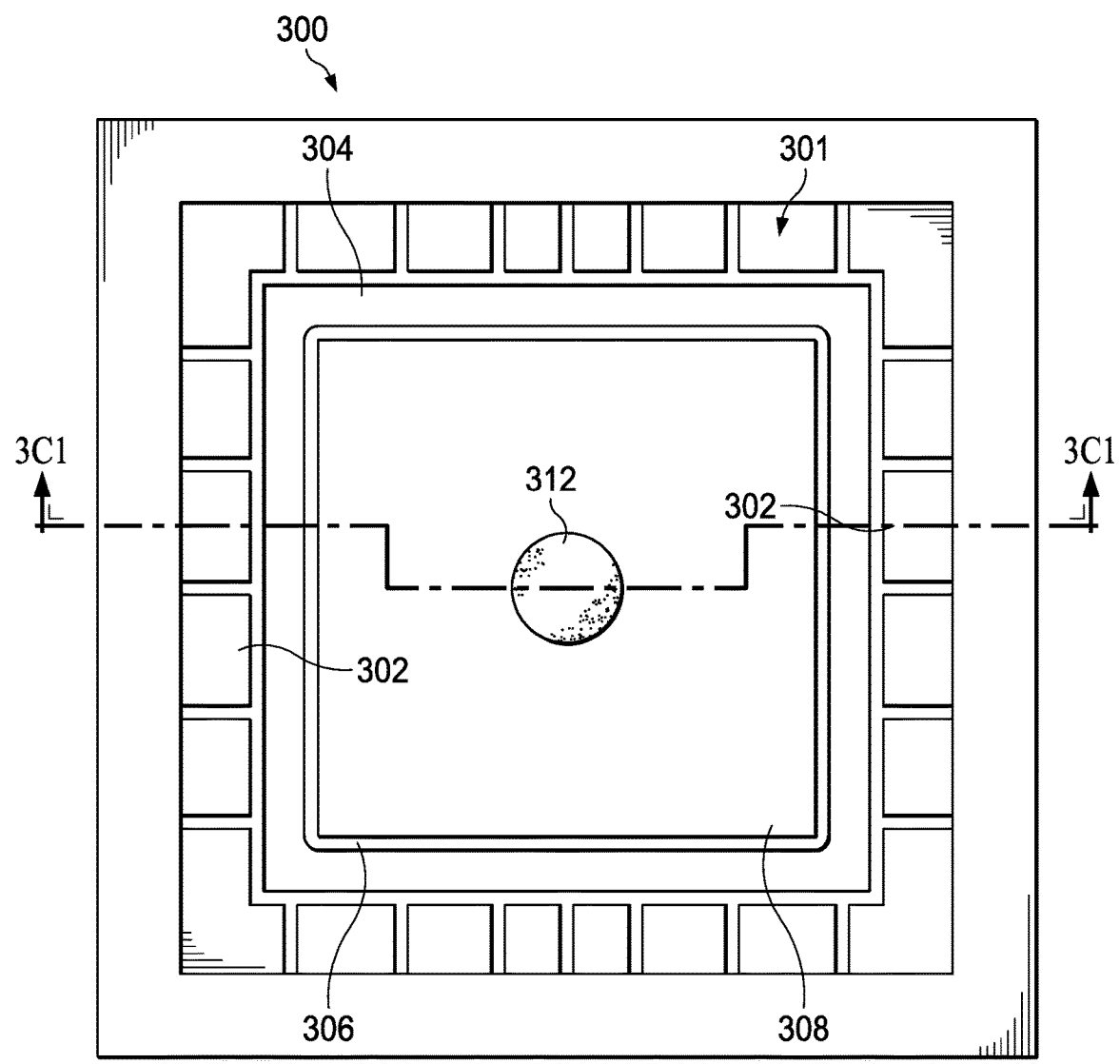
FIG. 3C2

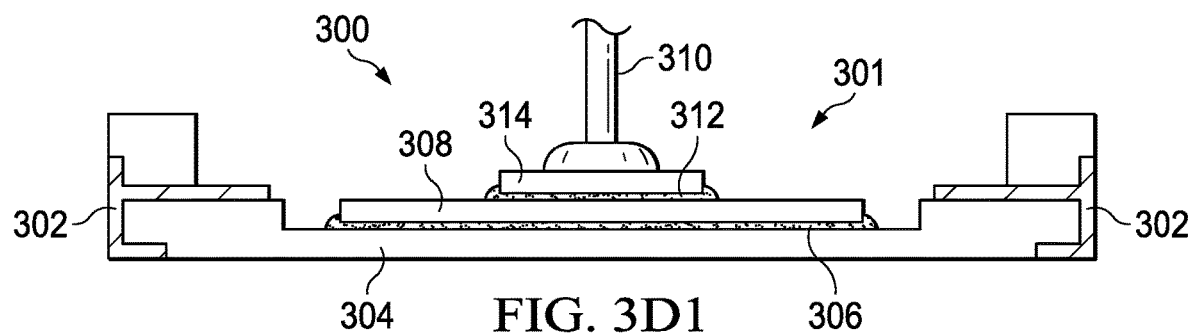
FIG. 3D1
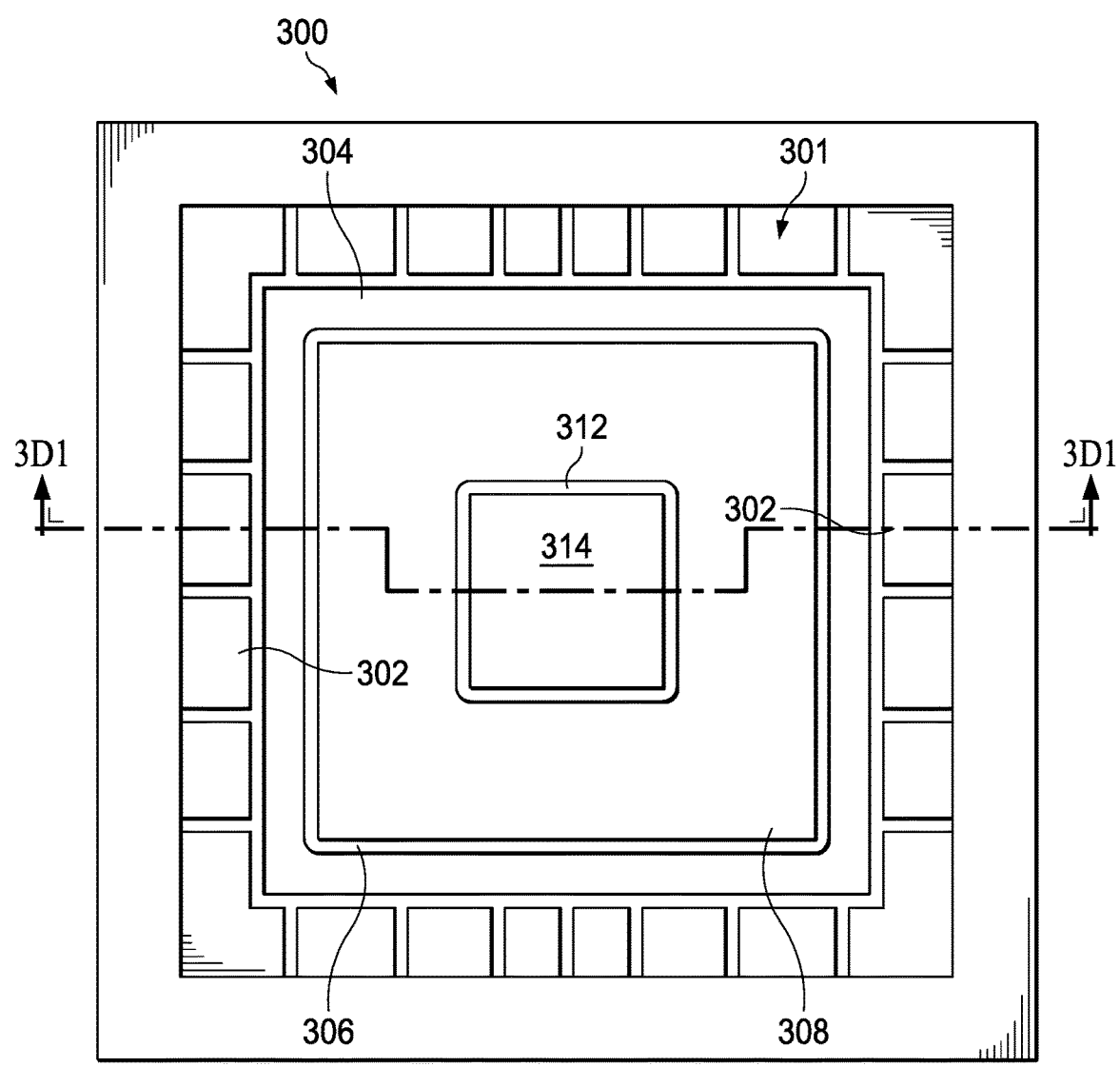
FIG. 3D2

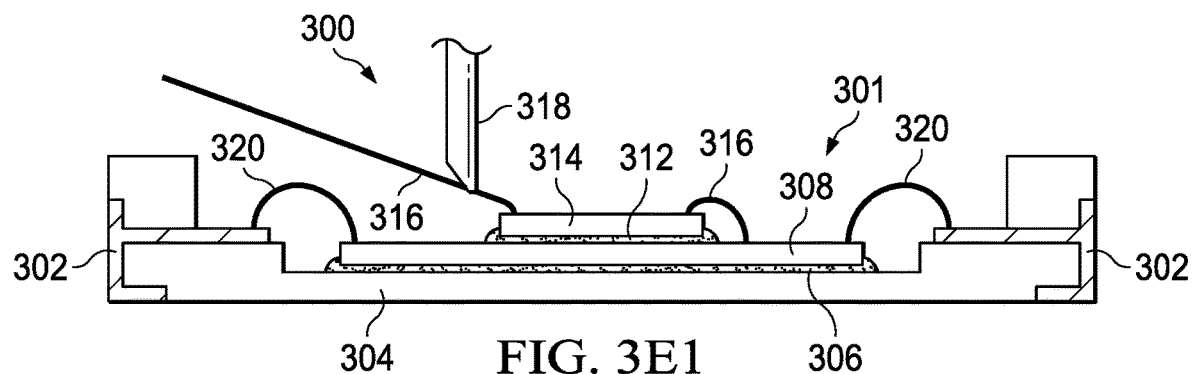
FIG. 3E1
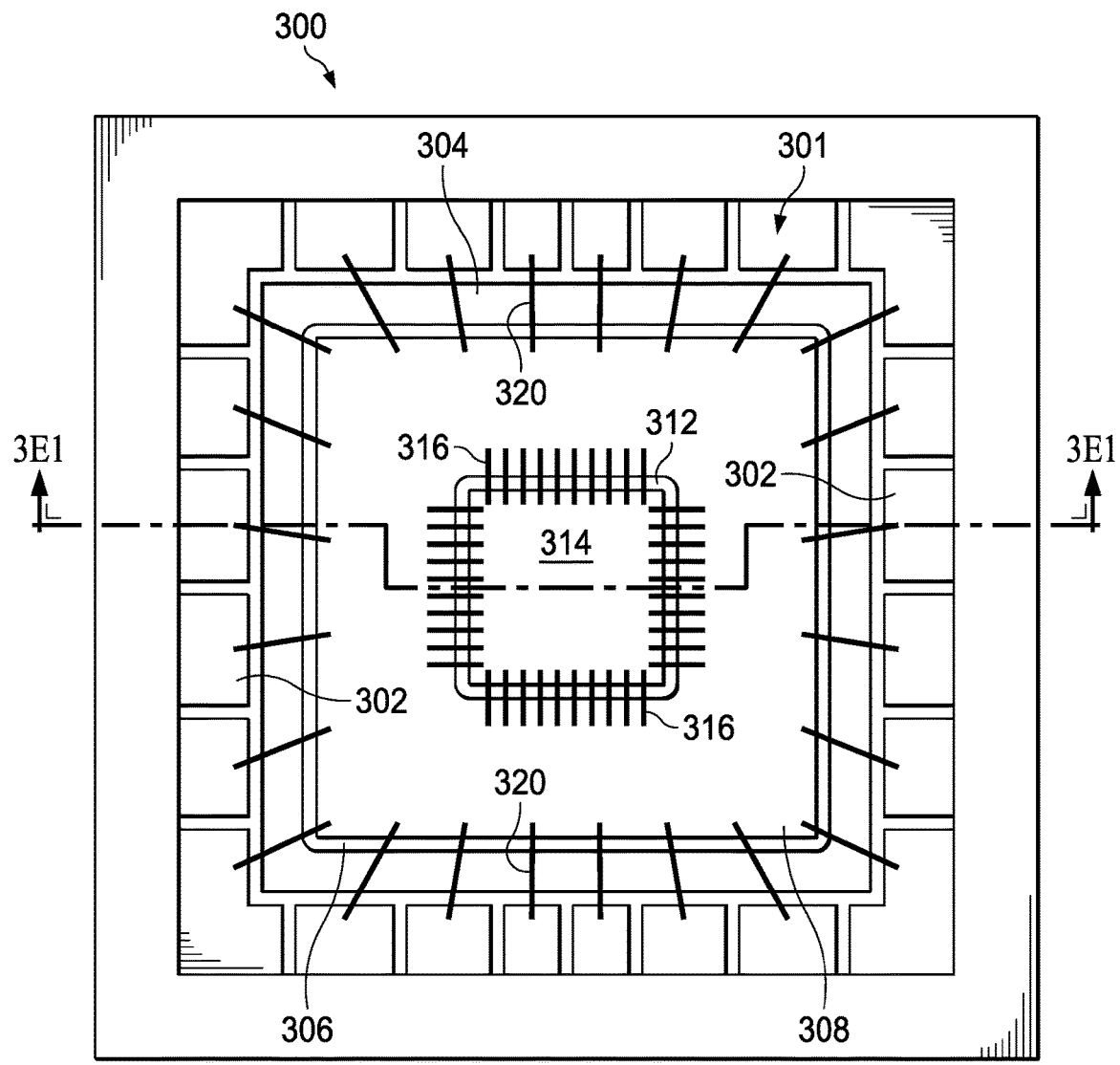
FIG. 3E2

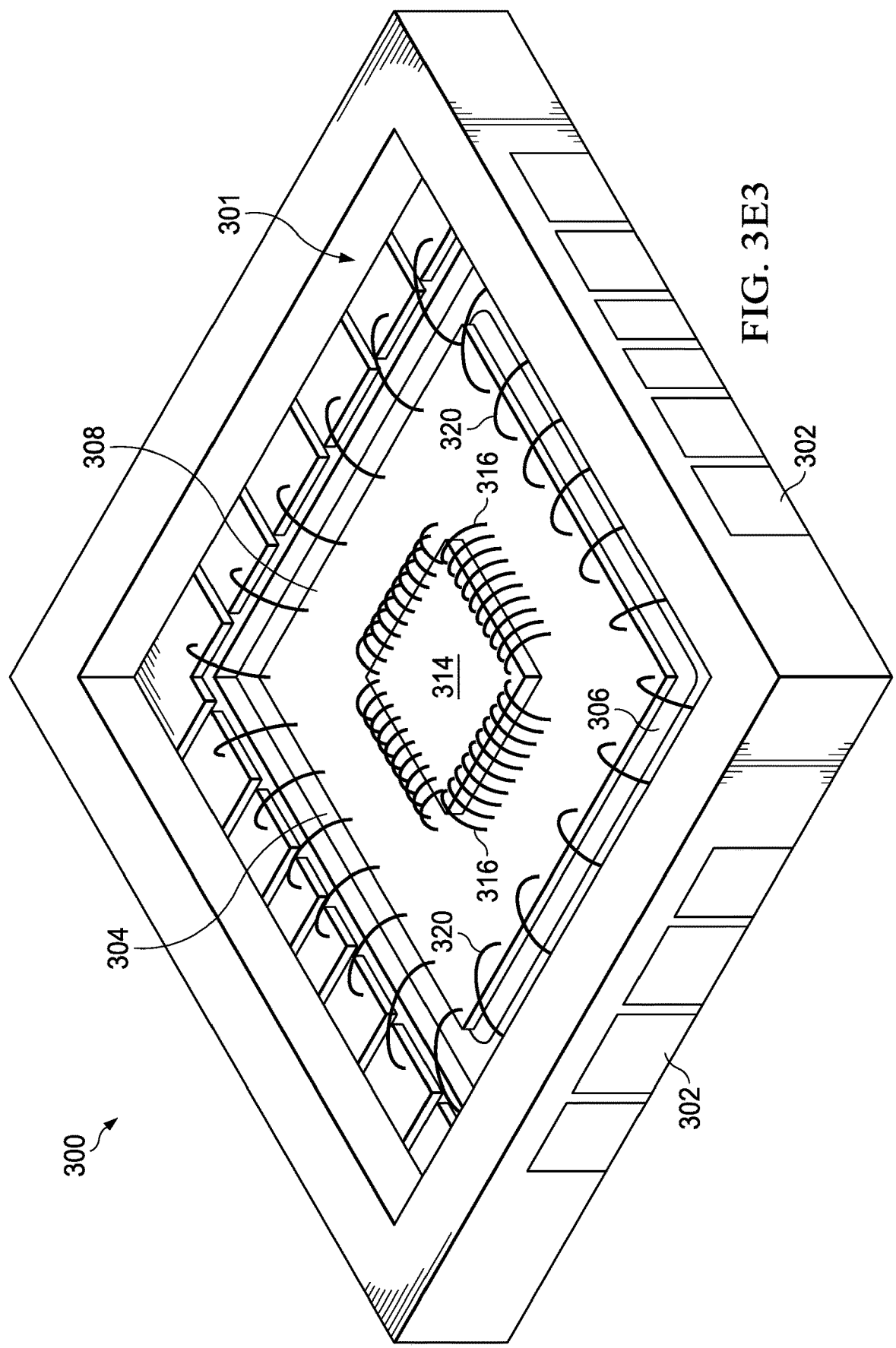
FIG. 3E3

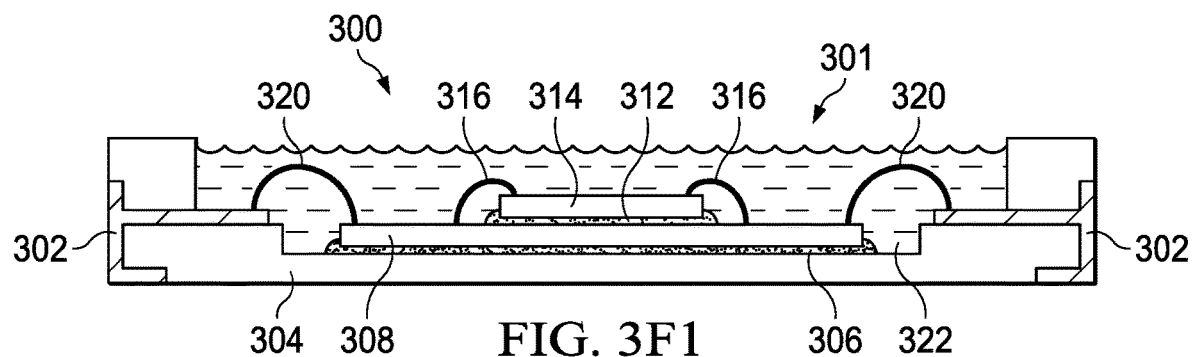
FIG. 3F1
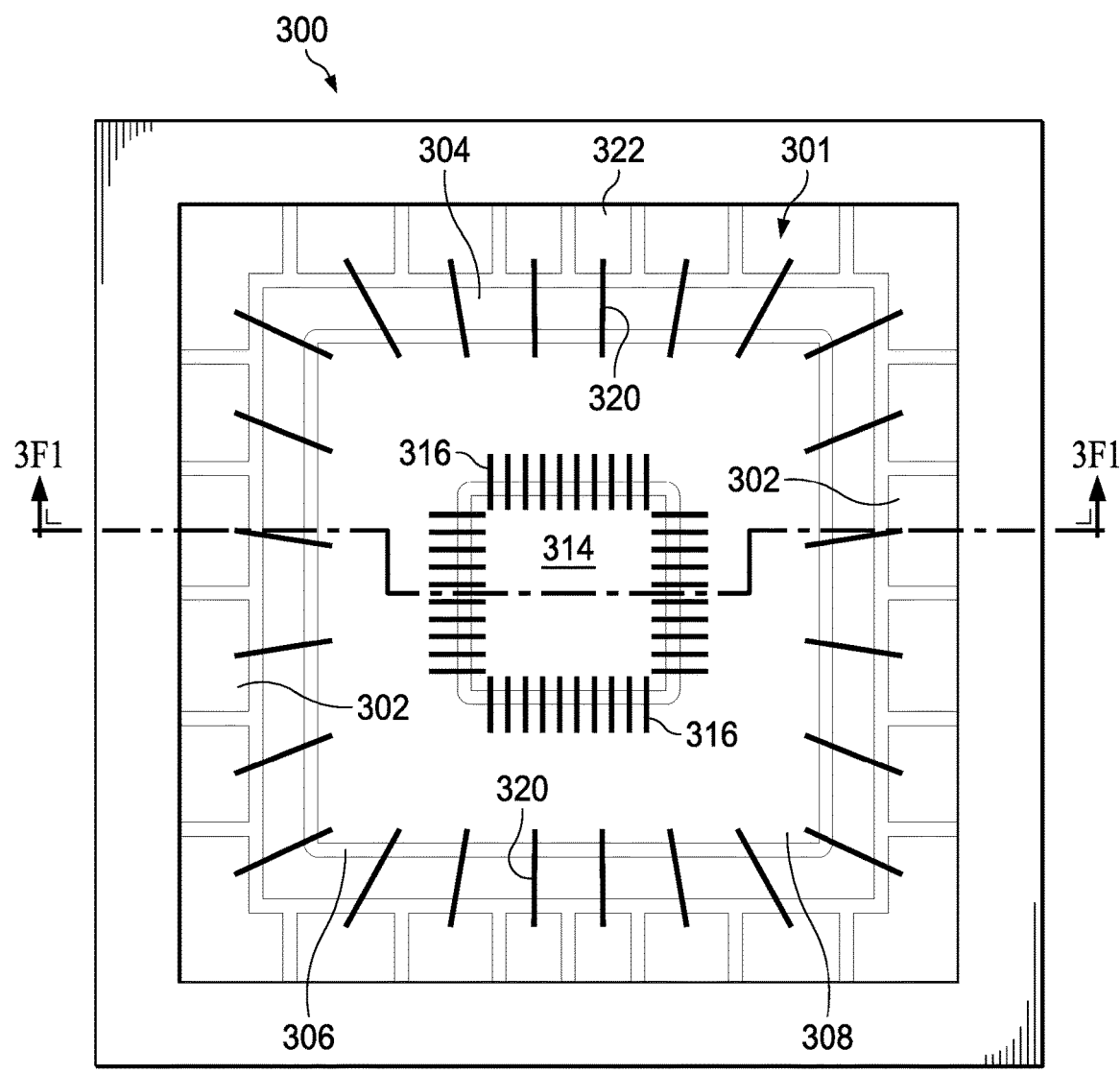
FIG. 3F2

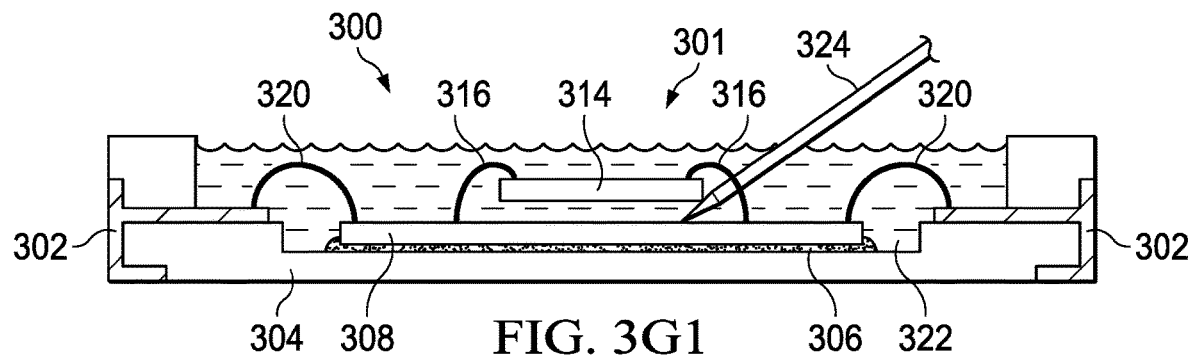
FIG. 3G1
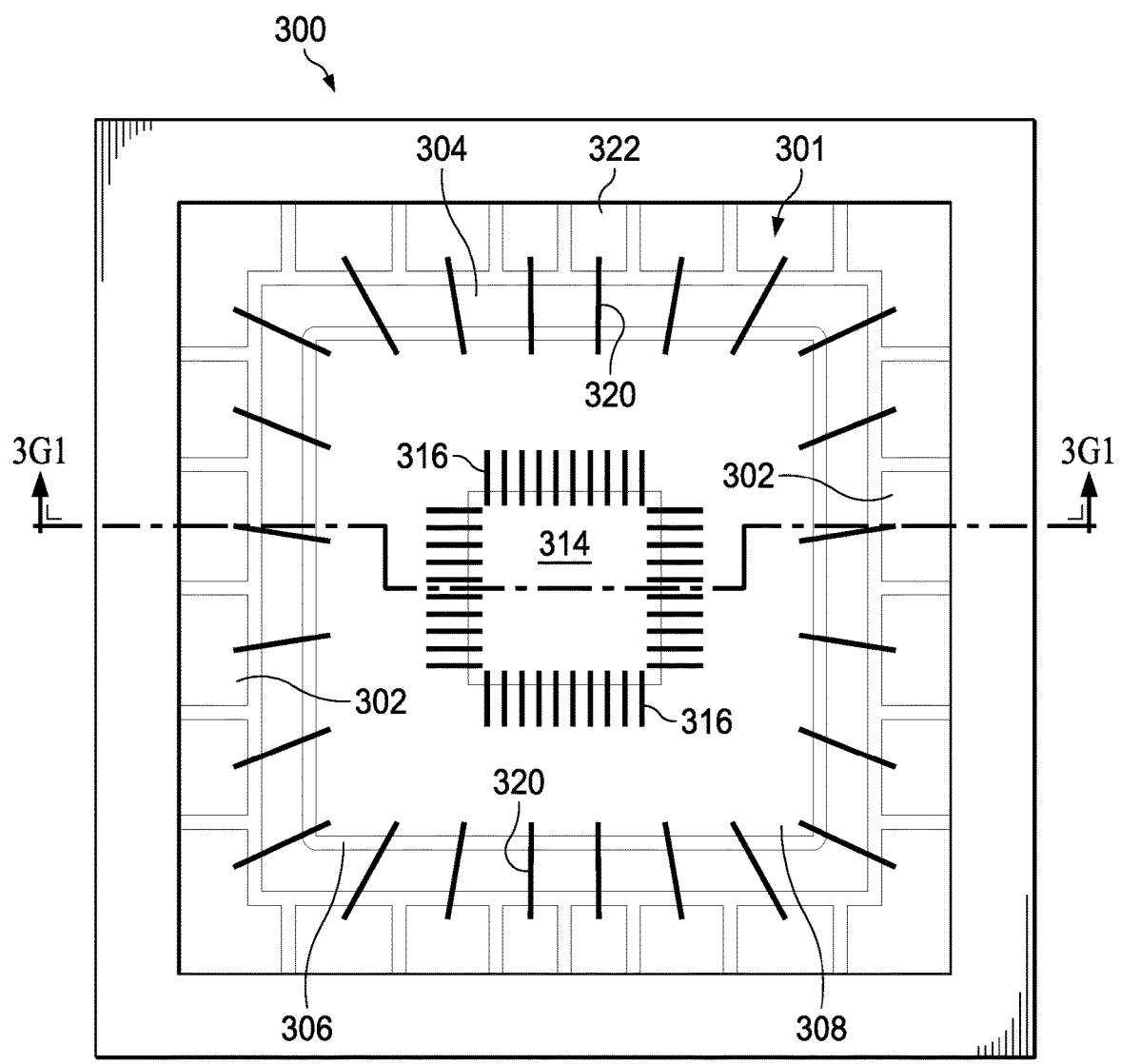
FIG. 3G2

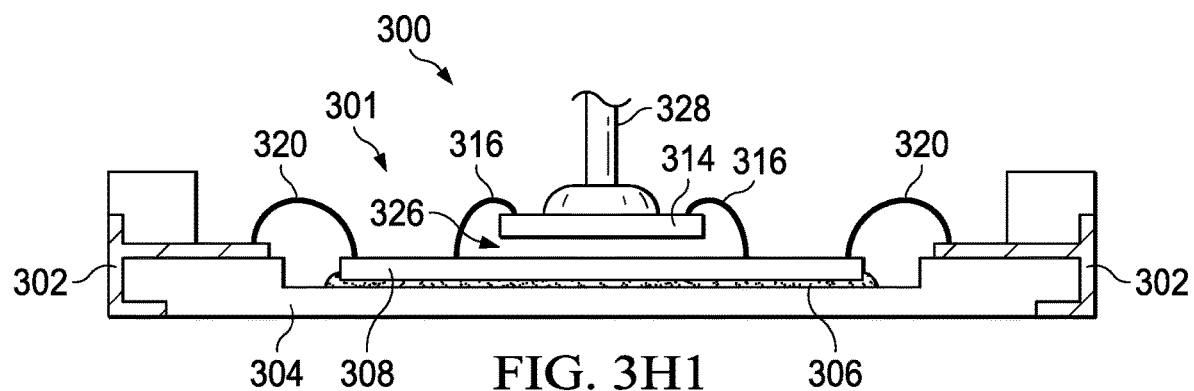
FIG. 3H1
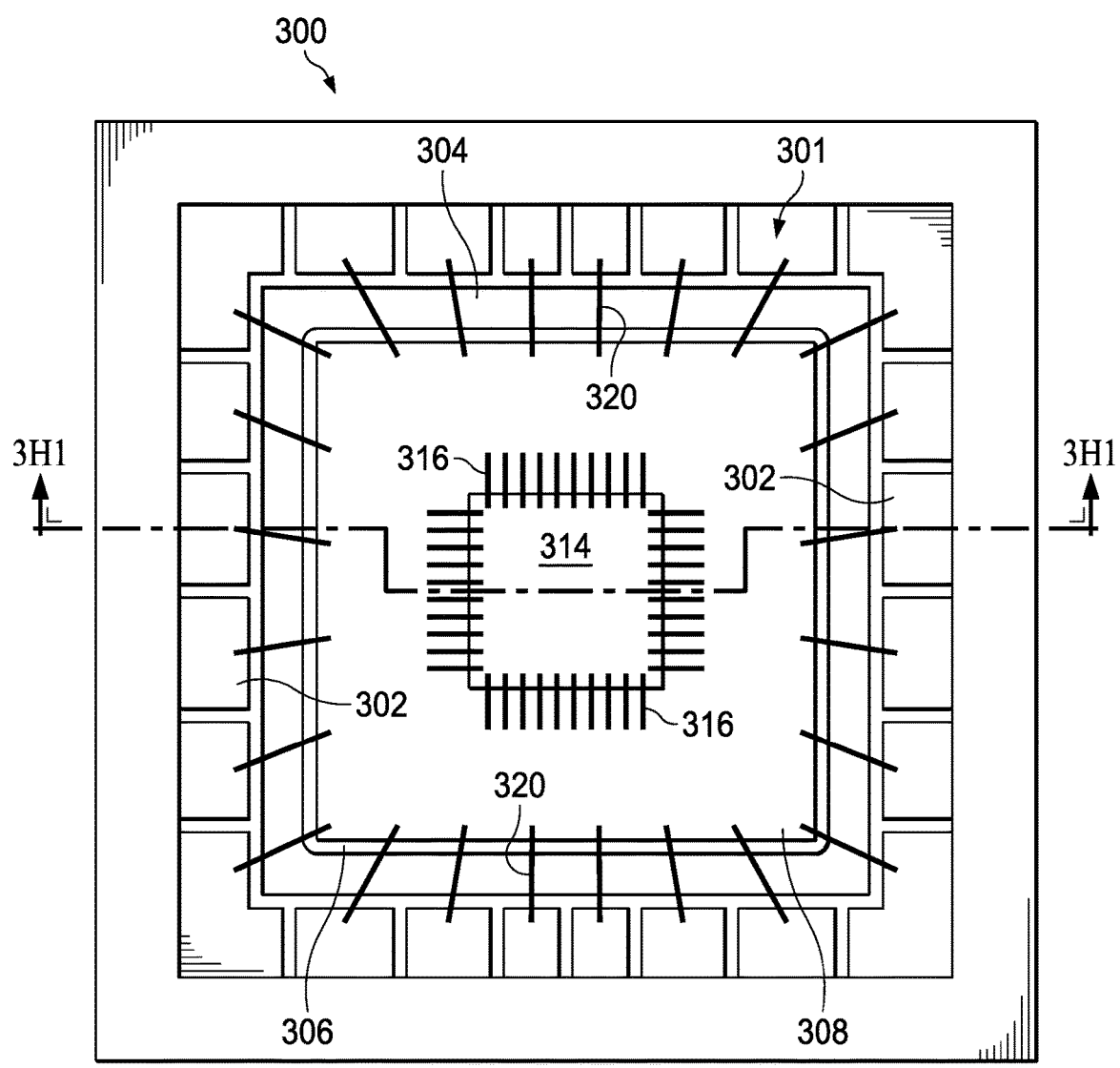
FIG. 3H2

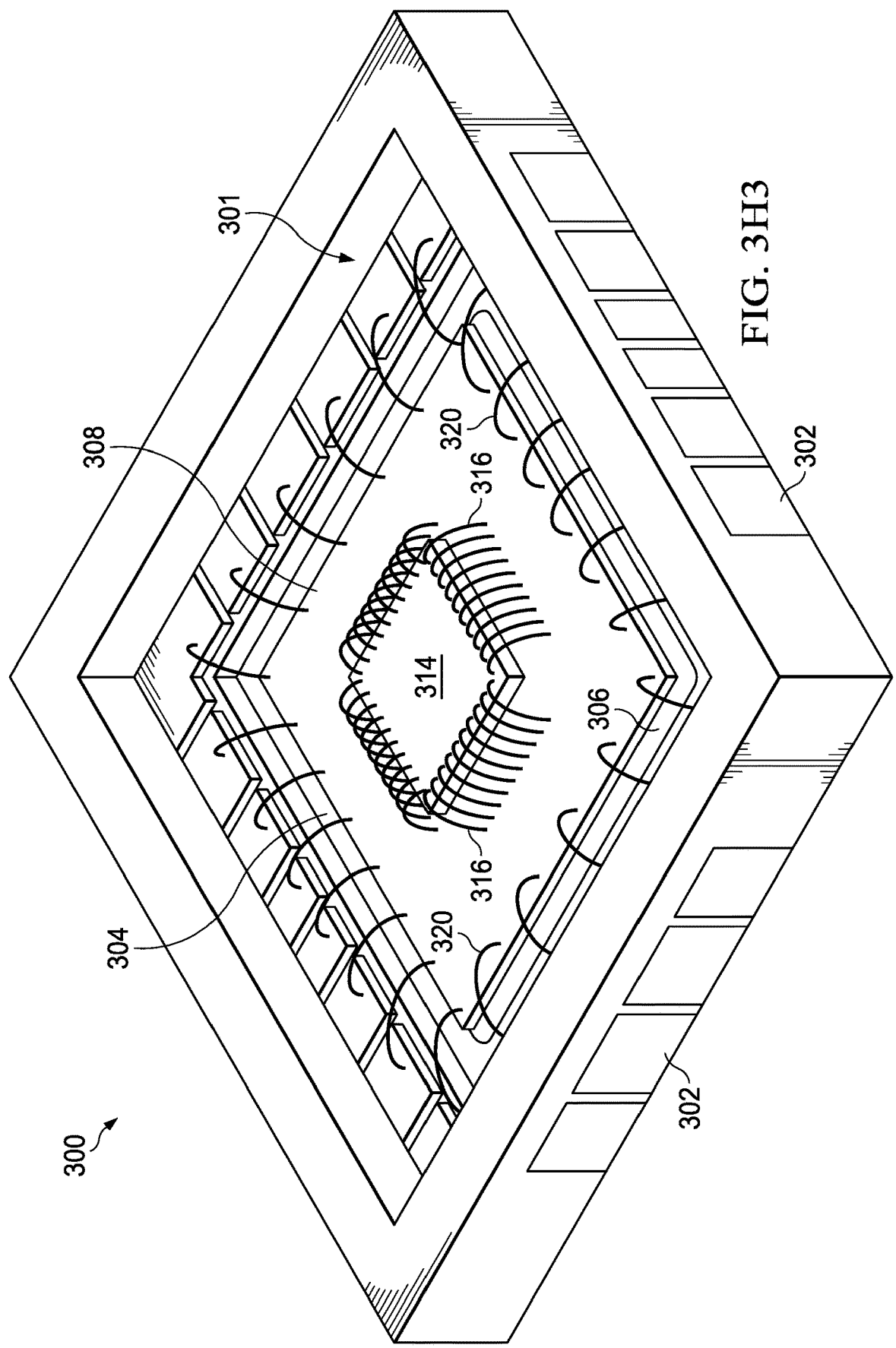
FIG. 3H3

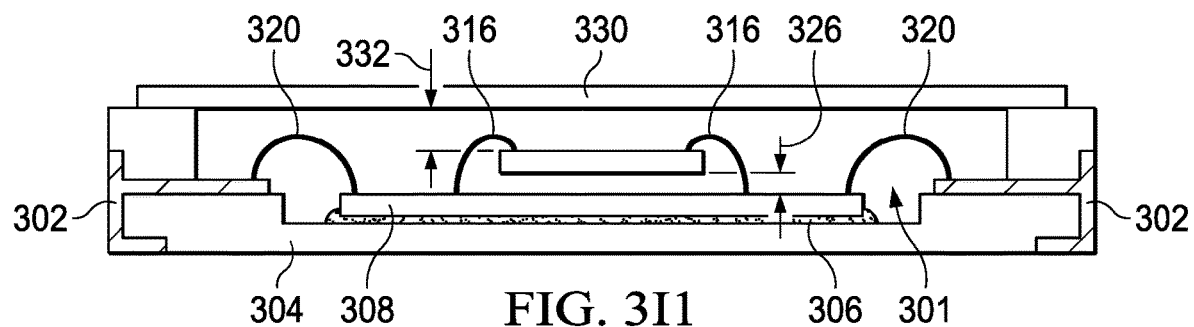
FIG. 3I1
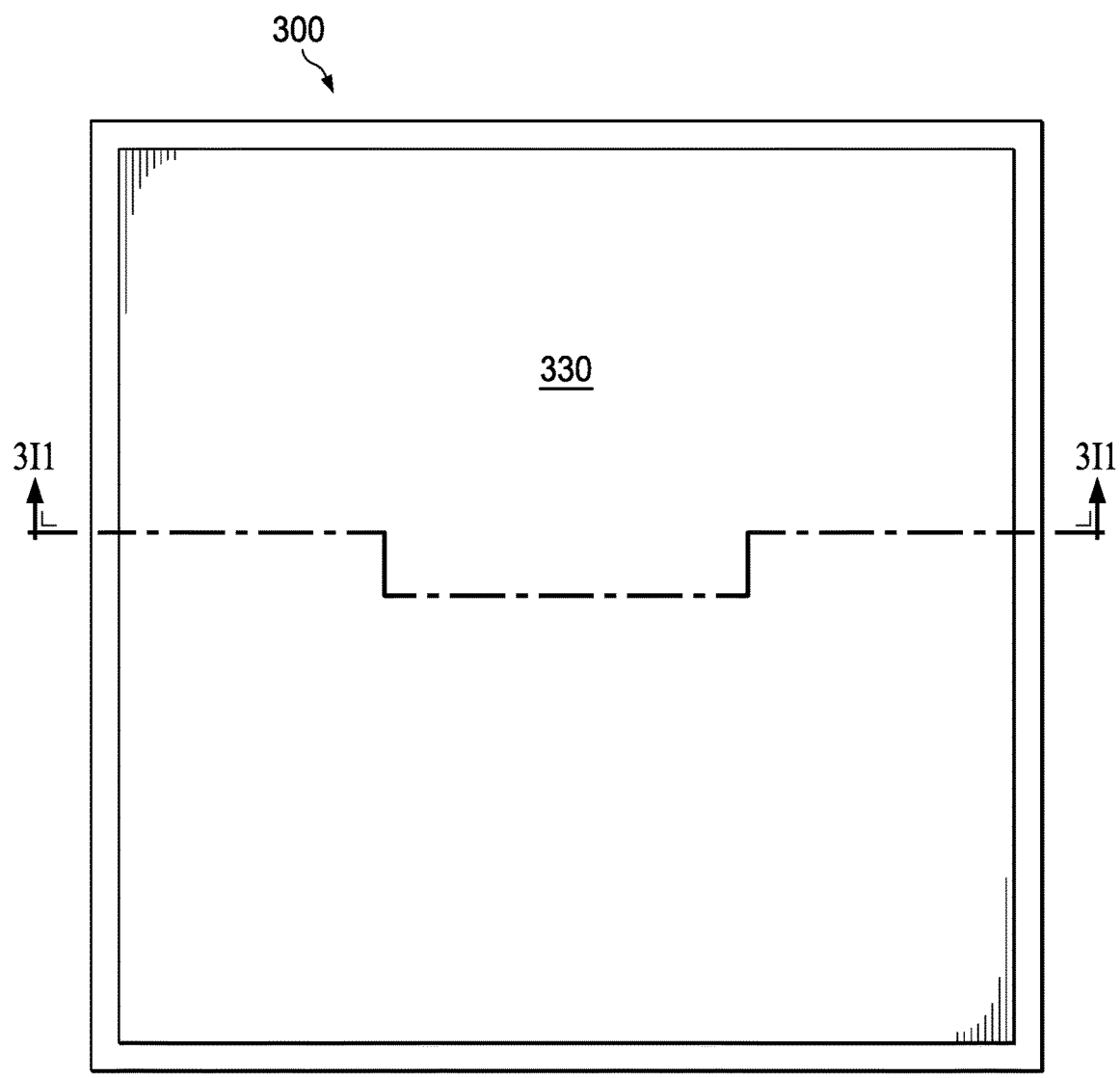
FIG. 3I2

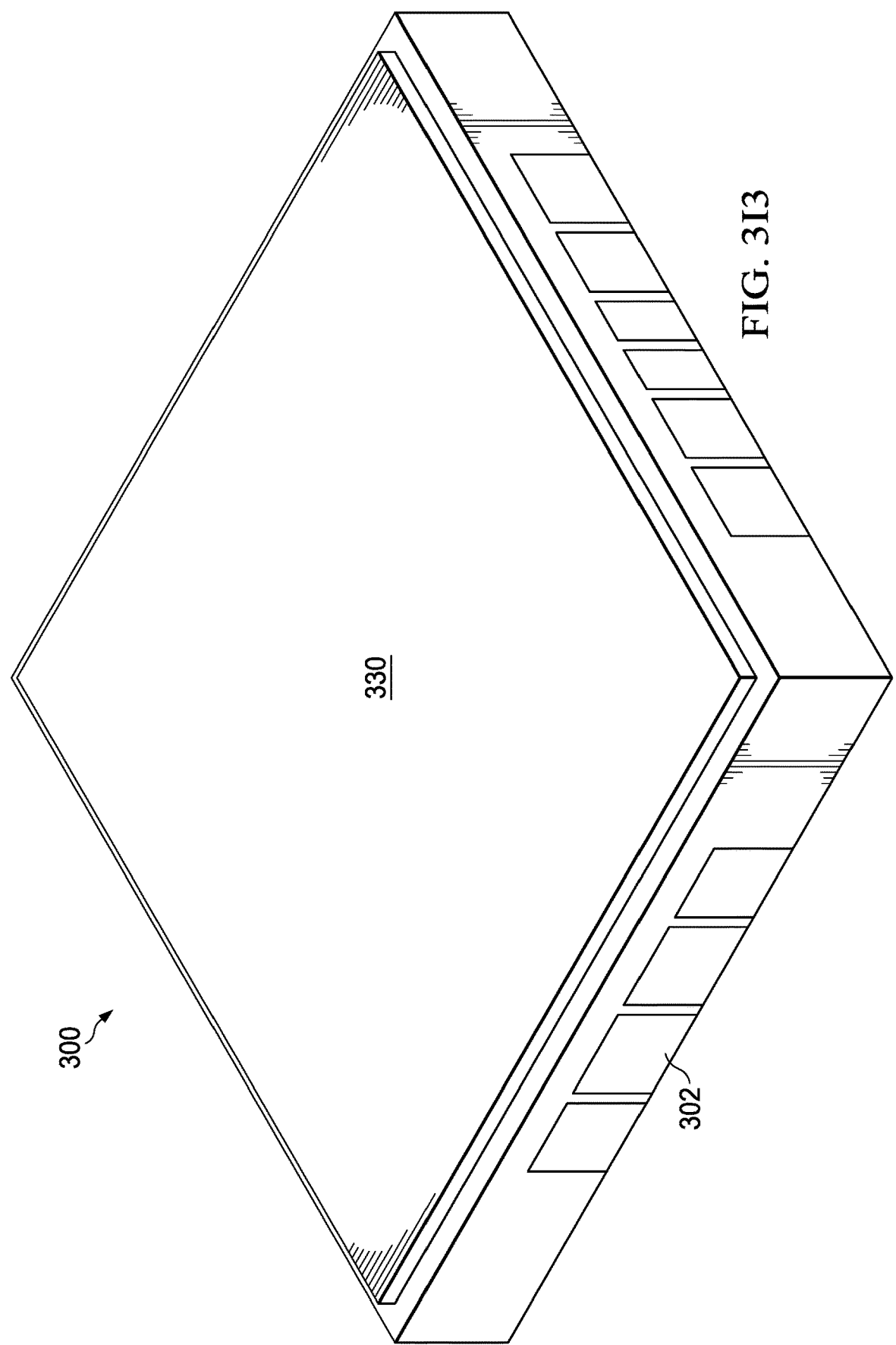
FIG. 3I3

SUSPENDED SEMICONDUCTOR DIES

BACKGROUND

During manufacture, semiconductor dies are frequently mounted on die pads of lead frames and are wire-bonded, clipped, or otherwise coupled to leads of the lead frame. Other devices may similarly be mounted on the die pad or on another lead frame pad. The assembly is later covered by a mold compound, such as epoxy, to protect the assembly from potentially damaging physical trauma, moisture, and other deleterious factors. After detachment from its lead frame strip, the finished assembly is called a semiconductor package or, more simply, a package. The conductive terminals (e.g., leads) are exposed to an exterior of the package and are used to electrically couple the packaged semiconductor die to devices outside of the package.

SUMMARY

In examples, an electronic device comprises a printed circuit board (PCB), an orifice extending through the PCB, and a semiconductor die suspended above the orifice by aluminum bond wires. The semiconductor die is vertically aligned with the orifice and the bond wires coupled to the PCB.

In examples, a method comprises covering a first end of an orifice in a printed circuit board (PCB) with a semiconductor die, the orifice extending through the PCB, applying a suction to a second end of the orifice opposing the first end to hold the semiconductor die in place, coupling aluminum bond wires to the semiconductor die and the PCB, and causing the semiconductor die to elevate above the PCB by ceasing to apply the suction.

BRIEF DESCRIPTION OF THE DRAWINGS

For a detailed description of various examples, reference will now be made to the accompanying drawings in which:

FIGS. 1A1-1G3 depict a process flow for suspending a semiconductor die over a printed circuit board (PCB), in accordance with various examples.

FIGS. 3A1-3I3 depict a process flow for suspending a semiconductor die over another die within a semiconductor package, in accordance with various examples.

DETAILED DESCRIPTION

Figure 2:
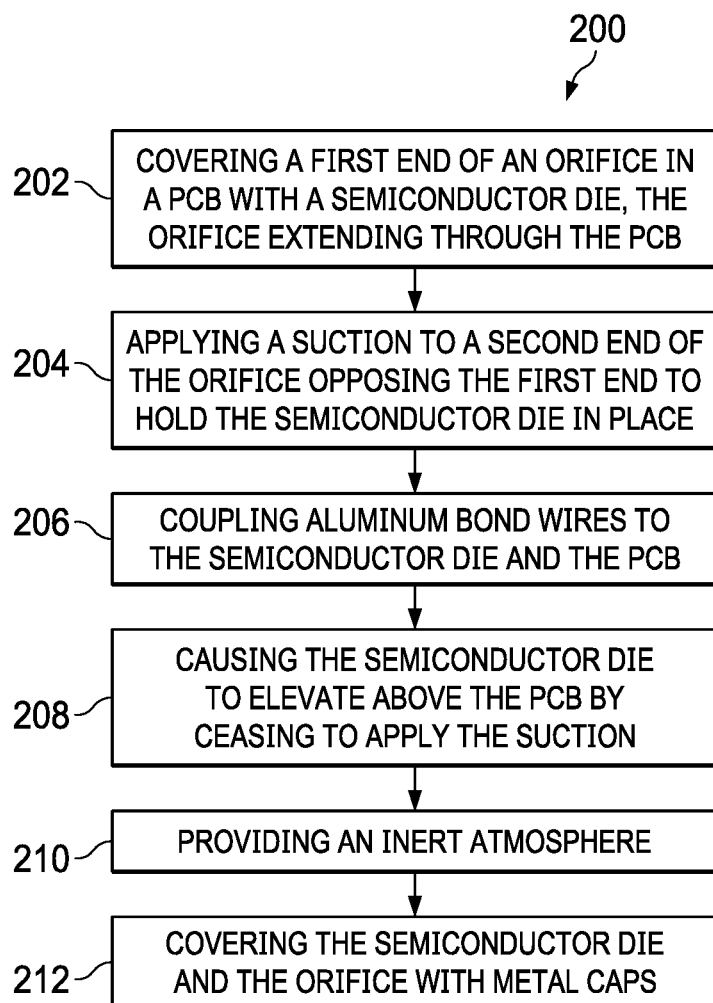
FIG. 2 is a flow diagram of a method for suspending a semiconductor die over a PCB, in accordance with various examples.

Certain types of high-precision semiconductor dies are particularly sensitive to mechanical and thermal influences, such as vibration and temperature fluctuations. Representative examples of such dies include those that generate reference voltage signals as well as dies having sensor and operational amplifier circuits. Semiconductor packages can be disadvantageous to the operation of such high-precision dies. For instance, mismatches in the coefficient of thermal expansion (CTE) between the semiconductor die, semiconductor package mold compound, and lead frame components (e.g., die pad) can introduce stress to the semiconductor die. In some cases, thermal contact between the semiconductor package and the semiconductor die may allow ambient temperature changes to transfer to and affect the semiconductor die. Eliminating the semiconductor packages, however, is unhelpful as it may expose dies to other deleterious environmental influences, such as moisture and physical trauma.

This disclosure describes various examples of a suspended semiconductor die. Specifically, this disclosure describes various examples of a semiconductor die suspended above a PCB using bond wires that are coupled to the PCB. In some examples, the bond wires are composed of aluminum and thus have elastic, spring-like properties, meaning that the bond wires have the ability to return to their original shapes when released after being distorted by external mechanical forces. For instance, mechanical vibrations may temporarily distort the bond wires and the position of the suspended semiconductor die, but the bond wires' elastic properties return the suspended semiconductor die to its original position. In addition, the bond wires have thermally insulative properties (e.g., relatively large ratio of wire length to wire diameter) that mitigate the transfer of heat from the PCB to the suspended semiconductor die. In this way, the semiconductor die is protected from mechanical and thermal trauma without the use of a package. Accordingly, suspended semiconductor dies are exposed, meaning that the semiconductor dies are not included inside semiconductor packages (e.g., are not covered by mold compounds). In some examples, a suspended semiconductor die is suspended inside a semiconductor package, and the semiconductor package may be mounted on a PCB using, e.g., solder bumps. Specifically, in such examples, the semiconductor package may include a first semiconductor die on a die pad and a second, suspended semiconductor die suspended above the first semiconductor die by bond wires coupled to the first semiconductor die. The first and second semiconductor dies couple to and communicate with each other using the bond wires, and the first semiconductor die couples to and communicates with other circuits via additional bond wires that couple the first semiconductor die to conductive terminals (e.g., leads) of the semiconductor package. Examples of such suspended semiconductor dies, as well as examples of methods to manufacture such suspended semiconductor dies, are now described with respect to the drawings.

FIGS. 1A1-1G3 depict a process flow for suspending a semiconductor die over a PCB, in accordance with various examples. FIG. 2 is a flow diagram of a method 200 for suspending a semiconductor die over a PCB, in accordance with various examples. Accordingly, FIGS. 1A1-1G3 are now described in tandem with the example method 200 of FIG. 2.

The method 200 begins by covering a first end of an orifice in a printed circuit board (PCB) with a semiconductor die, with the orifice extending through the PCB (202). FIG. 1A1 shows an example PCB 100. The PCB 100 may include an orifice 132 that extends through a thickness of the PCB 100 (which, in some examples, may range from 0.05-0.15 inches). In examples, the orifice 132 has a cylindrical shape, with a circular or ovoid horizontal cross-section, although other cross-sectional shapes (e.g., rectangular) are contemplated. In examples, the orifice 132 has a diameter (e.g., 0.05-0.15 inches) that is no larger than the smallest dimension of the semiconductor die that is to be suspended as described herein, for example, a semiconductor die 138 described below.

In examples, the PCB 100 comprises multiple metal layers (e.g., copper layers, gold-plated copper layers) on surfaces of the PCB 100 and within the PCB 100. For example, as shown, the PCB 100 may include surfaces 101 and 103, with surface 101 having positioned thereupon metal layers 102, 104, 106, 108, 110, and 112, and with surface 103 having positioned thereupon metal layer 130. In addition, the PCB 100 may include metal layers within the PCB 100, for example, in between the surfaces 101, 103. For instance, the PCB 100 may include metal layers 122, 124, 126, and 128. Furthermore, the PCB 100 may include one or more metal vias, for example, vias 114, 116, 118, and 120. The vias 114, 116, 118, and 120 may connect different metal layers of the PCB 100 to each other. For example, as shown, via 114 couples metal layers 104 and 124 together. The specific shapes, patterns, and/or positions of the metal layers and vias of the PCB 100 may vary according to a targeted design or application. However, in at least some examples, at least some of the metal layers on the surface 101 are arranged in a symmetrical pattern. For instance, as the top-down view of FIG. 1A2 shows, the metal layers 102, 104, and 106 are arranged in a circular pattern. Such symmetrical (e.g., circular) patterns can be useful when suspending a semiconductor die above the surface 101 by bond wires coupled to the metal layers in the symmetrical patterns because the symmetrical patterns result in an approximately even distribution of mechanical forces (e.g., gravity) among the bond wires supporting the semiconductor die. As described in greater detail below, in some examples, the source of the metal layers may be arranged in a pattern that helps insulate the suspended semiconductor die from deleterious external influences.

FIG. 1B is a profile, cross-sectional view of the PCB 100 positioned on a platform 134. The platform 134 includes an orifice 136 that is vertically aligned with the orifice 132. For example, a vertical axis may extend through both the orifices 136, 132. In examples, the orifice 136 extends through the thickness of the platform 134. In examples, the orifice 136 has a cylindrical shape with a circular or ovoid cross-section, although other cross-sectional shapes (e.g., rectangular) are contemplated. In examples, the orifice 136 has a length that is equivalent to the thickness of the platform 134. In examples, the orifice 136 has a diameter of approximately 0.5 inches. In examples, the diameter of the orifice 136 is sufficiently large relative to the size of the PCB 100 such that, when a vacuum is applied to the bottom end of the orifice 136, the PCB 100 is held in place. In other examples, the PCB 100 is attached to the platform 134, such as by using an adhesive or a clamp, and the PCB 100 may later be removed from the platform 134 using a suitable material such as a solvent to remove the adhesive. Other mechanisms for attaching the PCB 100 to the platform 134 are contemplated, for instance, using a mechanical coupling mechanism such as a clamp, screw, etc.

FIG. 1C1 is a profile, cross-sectional view of the structure of FIG. 1B but with the addition of a semiconductor die 138 positioned on the surface 101 of the PCB 100. In particular, the semiconductor die 138 may be positioned on the surface 101 of the PCB 100 and covering the orifice 132, as shown. In examples, the semiconductor die 138 is centered over the orifice 132, although the scope of this disclosure is not limited as such. In examples, the semiconductor die 138 is positioned on the surface 101 without being attached to the surface 101. FIG. 1C2 is a top-down view of the structure of FIG. 1C1.

The method 200 of FIG. 2 also comprises applying a suction (e.g., negative air pressure) to a second end of the orifice opposing the first end to hold the semiconductor die in place (204). FIG. 1D depicts the structure of FIG. 1C1, but with the application of a vacuum 144 at an end of the orifice 136 that is distal to the PCB 100. In examples, the vacuum 144 forms a seal around the orifice 136 and generates a suction on the semiconductor die 138 via the orifices 136, 132. In this way, the vacuum 144 causes the semiconductor die 138 to be held in place and to reduce or eliminate movement of the semiconductor die 138 during subsequent wirebonding. Holding the semiconductor die 138 in place is beneficial not only to facilitate accuracy in forming wirebonds, but also to promote energy efficiency in forming wirebonds by directing the energy used to form wirebonds into the wirebonds themselves, which may not be achieved if there is movement of the semiconductor die 138. In this way, the wirebonds are more accurately placed and are higher-quality bonds than would otherwise be the case. Although specific implementation details may vary, in one example, in an environment with atmospheric pressure of 14.7 lbs/in$^2$ a vacuum pressure of 1 Torr may be applied via an orifice 136 diameter of approximately 0.15 inches, resulting in a downward force on the semiconductor die 138 of approximately 0.25 lbs. Thus, the downward force applied to the semiconductor die 138 is a function of the difference between the atmospheric pressure (e.g., 760 Torr), the pressure applied by the vacuum 144 (which may range between approximately 1-10 Torr), and the area of the semiconductor die 138 exposed to the orifice 136.

The method 200 further includes coupling aluminum bond wires to the semiconductor die and the PCB (206). FIG. 1E1 depicts the structure of FIG. 1D, but with the application of bond wires 140. In examples, the bond wires 140 couple the semiconductor die 138 (e.g., bond pads on an active surface 139 of the semiconductor die 138, such as the surface on and/or in which an integrated circuit is formed) to the metal layers on the surface 101 of the PCB 100. In examples, the bond wires 140 are composed of aluminum, because aluminum has elastic properties, meaning that each of the aluminum bond wires 140 provides a residual upward spring force on the semiconductor die 138. For example, the bond wires 140 have a Young's modulus of approximately 69-70 GPa. In other examples, gold, with a Young's modulus of approximately 79 GPa, may be used in lieu of aluminum. Other materials that provide similar elastic properties also may be used in lieu of aluminum. In examples, the bond wires 140 have a maximal diameter of approximately 2 mils, and in other examples, the bond wires 140 have a maximal diameter of approximately 1 mil, as thinner bond wires 140 mitigate heat transfer from the PCB 100 to the semiconductor die 138. In examples, each of the bond wires 140 has a thermal resistance ranging from 20,000 degrees C./W and higher, with higher thermal resistance values being advantageous to achieve the specific thermal effects described below.

In an example, the thermal conductivity of aluminum is 225 W/mk, and thus for an aluminum bond wire 140 having a 1 mil diameter and 200 mil length where the temperature difference between the semiconductor die 138 and the PCB 100 is in the range of 55 degrees Celsius, that bond wire 140 has an equivalent thermal resistance of approximately 46,000 degrees C./W. In examples, the bond wires 140 are bonded to the semiconductor die 138 and the PCB 100 using a wedge bonding technique (e.g., with aluminum), although other techniques, such as ball bonding techniques, are contemplated as well. In examples, the bond wires 140 have a length of approximately 100-300 mils to achieve the specific thermal effects described below. In examples, the bond wires 140 have an appropriate length so that the semiconductor die 138, after the suction from the vacuum 144 is turned off, is suspended above the PCB 100 at a height that precludes impact against the PCB 100 if the PCB 100 is jostled or moved. In examples, the bond wires 140 are bonded to have a loop height not exceeding approximately 80 mils, as loop heights greater than this may have insufficient clearance space when a cap, such as the caps described below, are used to cover the bond wires 140. In some examples, a sufficient number of bond wires 140 should be used in light of the weight (or mass) of the semiconductor die 138, with a greater number of bond wires 140 being helpful in this regard and a lesser weight (or mass) of the semiconductor die 138 also being helpful in this regard.

FIG. 1E2 depicts a top-down view of the structure of FIG. 1E1. As shown in FIG. 1E2, in some examples, the bond wires 140 are arranged in a symmetrical pattern, for example a circular pattern. Such a symmetrical pattern facilitates an even distribution of mechanical forces (e.g., gravitational pull on the semiconductor die 138; movement (e.g., vibrations) or jostling of the PCB 100) among the various bond wires 140. In contrast, an asymmetrical pattern may result in an uneven distribution of mechanical forces on the various bond wires 140, with some bond wires 140 receiving a disproportionately large share of mechanical forces and thus being damaged or otherwise compromised. In addition, a symmetrical pattern among the bond wires 140 may be beneficial because it facilitates approximately identical thermal flux in each bond wire 140, resulting in approximately identical temperatures at the ends of the bond wires 140 distal to the semiconductor die 138. Thus, no significant differences are present among the bond wires 140 in the heat flux imparted to the metal layers on the surface 101. In addition, the symmetrical pattern among the metal layers on the surface 101 of the PCB 100 may be beneficial because it facilitates approximately equal thermal conductivity among the metal layers to cancel potential thermo-electric effects arising due to the potential use of dissimilar metals. Approximately uniform temperatures among the various bonding locations on the surface 101 may be facilitated by the presence of the various metal layers on and in the PCB 100.

Symmetrical patterns for the bond wires 140 are also beneficial for the semiconductor die 138. Because the semiconductor die 138 is suspended, all or nearly all heat dissipation from the semiconductor die 138 occurs through the bond wires 140. The symmetrical pattern of the bond wires 140 promotes uniform thermal flow from the center of the semiconductor die 138 to the periphery of the semiconductor die 138. Knowledge and predictability of the thermal flux and temperature gradients on the semiconductor die 138 enables circuit designers to position components, such as transistors and passive components, on the semiconductor die 138 so as to mitigate the disturbance of temperature gradients on electrical performance.

In addition, with regard to high accuracy devices, temperature differences can result in thermocouple effects, for example at the end of bond wires 140 when aluminum bond wires 140 and copper PCB traces (e.g., dissimilar metals) are used together. When a pair of bond wires 140 is used to transfer a signal, such as a precision voltage, the thermocouple voltage on each end should be the same so that they will cancel. If the bond wires 140 are the same length and are side by side with the same thermal flux in each one, then the thermocouple voltage is the same and the voltage difference at the ends of the two bond wires 140 is free of thermocouple errors.

To facilitate the symmetrical pattern of the bond wires 140, metal layers on the surface 101 to which the bond wires 140 couple may also be arranged in a symmetrical (e.g., circular) pattern. For example, the metal layers 104, 106 may be arranged in a circular pattern as shown in FIG. 1E2, with the metal layer 104 coupling to other metal layers and vias than the metal layer 106, thus creating two separate electrical pathways. In a similar manner, the remaining metal layers 107 shown in FIG. 1E2 also may be arranged in the aforementioned symmetrical pattern with the metal layers 104, 106, and each of the metal layers 107 may couple to different vias, other metal layers, etc. to form multiple separate electrical pathways. In this way, each of the bond wires 140 provides a separate electrical pathway for a different bond pad on the semiconductor die 138. In some examples, one or more of the bond wires 140 is a non-conducting bond wire, meaning that its functional role is for mechanical support and not for conducting electrical signals between the semiconductor die 138 and the PCB 100 as is the case for the remaining bond wires 140. Other symmetrical patterns for the metal layers 104, 106, 107 on the surface 101, such as rectangular and ovoid patterns, are contemplated and included in the scope of this disclosure.

The method 200 comprises causing the semiconductor die to elevate above the PCB by ceasing to apply the suction (208). FIG. 1F1 depicts the structure of FIG. 1E1, except that the platform 134 and vacuum 144 are removed. Because the platform 134 and vacuum 144 are removed, no suction is applied in the orifice 132, and thus the semiconductor die 138 is no longer held in place against the surface 101 of the PCB 100. As a result, the aluminum bond wires 140, which have spring-like properties as explained above, cause the semiconductor die 138 to elevate above the surface 101 and be suspended above the surface 101 of the PCB 100. In some examples, the vacuum 144 may be turned off to allow the semiconductor die 138 to elevate, and after the semiconductor die 138 elevates, the vacuum 144 may apply a positive pressure (e.g., in the range of 0.25-5 PSI above atmospheric pressure) to precisely adjust the position of the semiconductor die 138. Alternatively or in addition, a die adjustment tool may be inserted into the orifices 136, 132 to manually adjust the position of the semiconductor die 138. In some examples, the semiconductor die 138 is vertically positioned above and in alignment with the orifice 132, such that a vertical axis extends through both the orifice 132 and the semiconductor die 138, for example, a center of the semiconductor die 138. FIG. 1F2 is a top-down view of the structure of FIG. 1F1. FIG. 1F3 is a perspective view of the structure of FIG. 1F1.

The method 200 of FIG. 2 also comprises providing an inert atmosphere (210) and covering the semiconductor die and the orifice with caps (212). FIG. 1G1 depicts a cross-sectional profile view of the structure of FIG. 1F1, but with the addition of caps 154, 156 as shown. In particular, prior to the coupling of the caps 154, 156 to the PCB 100, an inert atmosphere is induced around the semiconductor die 138 and the PCB 100. For example, a chamber that is backfilled with an inert gas such as nitrogen or argon may be used. After an inert atmosphere has been induced, the cap 154 is coupled to the surface 101 of the PCB 100 such that it covers the semiconductor die 138 and the orifice 132, as shown. Similarly, after the inert atmosphere has been induced, the cap 156 is coupled to the surface 103 such that it covers the orifice 132. Other sealing techniques also may be used.

In examples, the caps 154, 156 are composed of and/or coated (e.g., plated) with any suitable non-organic material, such as metal (e.g., copper) or ceramic. Any suitable metal may be used for the caps 154, 156, as metal is impermeable by deleterious environmental influences and thus facilitates hermetic sealing. In examples, the caps 154, 156 are formed using an extrusion process. In examples, each of the caps 154, 156 has a minimum thickness of 6 mils to promote the aforementioned impermeability, although in other examples, thinner caps may be used while still enabling hermeticity. In examples, the caps 154, 156 are coupled to the PCB 100 using a solder reflow process, although other adhesives and techniques are contemplated and included in the scope of this disclosure. In examples, the caps 154, 156 are coupled to the PCB 100 using eutectic solder seals. By introducing an inert atmosphere as described above and subsequently coupling the caps 154, 156 to the PCB 100, the volume 158 covered by the caps 154, 156 and within the orifice 132 is inert and is nearly entirely hermetically sealed from the surrounding environment. Specifically, such hermetic sealing is provided by the caps 154, 156 and the various metal layers on and in the PCB 100. To promote hermeticity, the metal layers on and in the PCB 100 may have a minimum thickness of 1.4 mils. Pathways not sealed by metal may exist between metal layers in the PCB 100, for example, pathway 161. Such pathways represent a minor, but possible, route of exposure to the environment surrounding the caps 154, 156. However, to mitigate this potential route of exposure, in some examples the PCB 100 is composed of a non-organic material such as ceramic, which promotes hermeticity more than other PCB materials, such as epoxy (e.g., by mitigating epoxy voids as well as outgassing via the PCB 100). In addition, to mitigate this potential route of exposure, the metal layers on and/or in the PCB 100 may be designed so that the non-sealed pathways (e.g., non-metal-seal pathway 161) are as long as possible while still satisfying relevant design specifications. FIG. 1G2 is a top-down view of the structure of FIG. 1G1. FIG. 1G3 is a perspective view of the structure of FIG. 1G1.

In examples, the clearance 150 between the PCB 100 and the semiconductor die 138 may be a minimum of 50 mils to prevent impact between the PCB 100 and the semiconductor die 138 due to movement, jostling, etc. In examples, the clearance 152 between the cap 154 and the bond wires 140 may be a minimum of 50 mils to prevent impact between the cap 154 and the bond wires 140 due to movement, jostling, etc. As mentioned above, to achieve such clearances, the lengths of the bond wires 140 may range from approximately 100 mils to approximately 300 mils, and the loop heights of the bond wires 140 before the suction is turned off may be approximately 80 mils. Such clearances are also facilitated by using appropriately sized caps 154, 156. In examples, the cap 154 has a depth that ranges from 180 to 300 mils, with a shallower cap 154 providing the advantage of less space occupation and with a deeper cap 154 providing the advantage of greater clearance from the bond wires 140. In some examples, the cap 156 has clearance requirements of the lower conductors of the PCB 100 and, as such, a minimum practical cap depth should be used, such as approximately 50 mils.

In some examples, the orifice 132 may be directly sealed using a suitable, non-organic material, such as metal or ceramic. For instance, the orifice 132 may be sealed using a non-organic layer of material positioned on the surface 101, on the surface 103, or on both the surfaces 101 and 103. In examples, the orifice 132 may be partially or fully filled using a material (e.g., non-organic material, such as solder) that is different from that with which the PCB 100 is composed. In examples where the orifice 132 is sealed or at least partially filled, the cap 156 may be omitted. When sealed or at least partially filled, the orifice 132 may still be referred to herein as an orifice.

Figure 4:
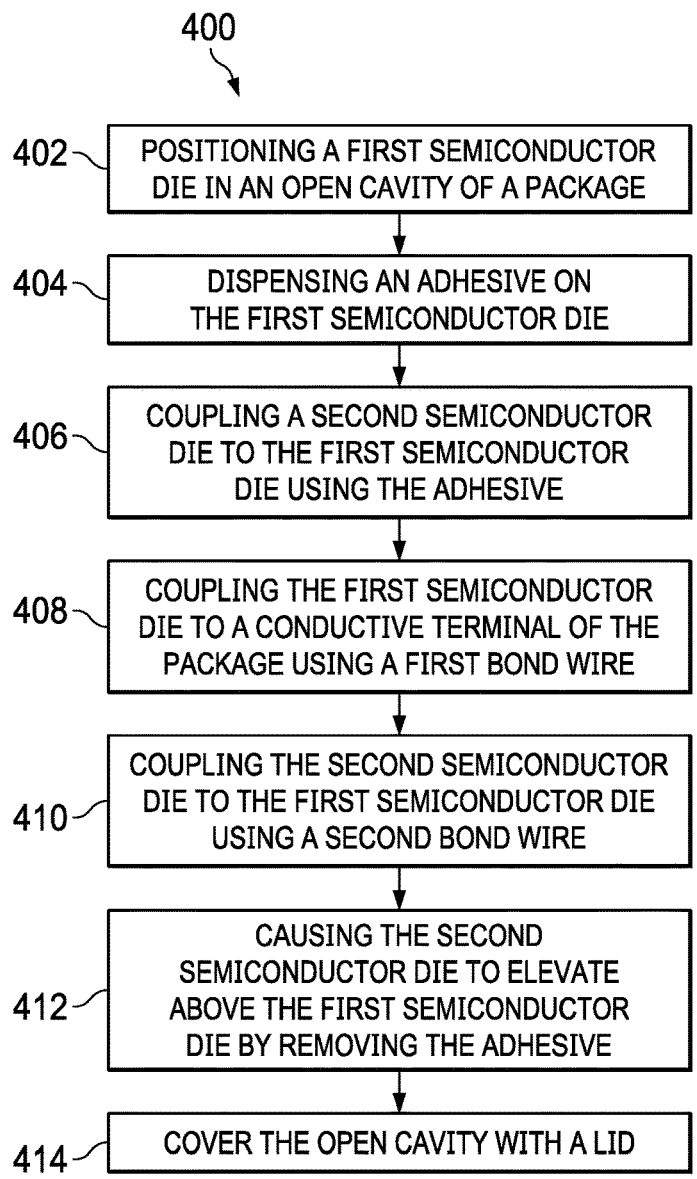
FIG. 4 is a flow diagram of a method for suspending a semiconductor die over another die within a semiconductor package, in accordance with various examples.

FIGS. 3A1-3I3 depict a process flow for suspending a semiconductor die over another die within a semiconductor package, in accordance with various examples. FIG. 4 is a flow diagram of a method 400 for suspending a semiconductor die over another die within a semiconductor package, in accordance with various examples. Accordingly, FIGS. 3A1-3I3 and 4 are now described in tandem.

The method 400 begins with positioning a first semiconductor die in an open cavity of a semiconductor package (402). FIG. 3A1 depicts a cross-sectional profile view of an open-cavity semiconductor package 300 including an open cavity 301 and conductive terminals 302 (e.g., quad-flat no-lead (QFN) style conductive terminals). The package 300 includes a die pad 304 and an adhesive 306 deposited on the die pad 304. FIG. 3A2 depicts a top-down view of the structure of FIG. 3A1. The adhesive 306 may include, for example, an epoxy.

FIG. 3B1 depicts the structure of FIG. 3A1, but with the addition of a semiconductor die 308 coupled to the die pad 304 using the adhesive 306. A die placement tool 310 may be used to properly position the semiconductor die 308 on the die pad 304. In some examples, the semiconductor die 308 is an interposer die, meaning that it contains no integrated circuit on its active surface, but it may include metal layers to facilitate the routing of electrical signals between another semiconductor die and the conductive terminals 302. In some examples, the semiconductor die 308 is not an interposer die, meaning that it includes an integrated circuit that performs one or more actions, and that it may also include metal layers to facilitate the routing of electrical signals between another semiconductor die and the conductive terminals 302. FIG. 3B2 is a top-down view of the structure of FIG. 3B1.

The method 400 comprises dispensing a removable adhesive (e.g., adhesive elastomer dissolved in an aromatic hydrocarbon such as methylbenzene) on the first semiconductor die (404). FIG. 3C1 depicts the structure of FIG. 3B1, but with the addition of adhesive 312 on top of the semiconductor die 308. FIG. 3C2 is a top-down view of the structure of FIG. 3C1. The method 400 includes coupling a second semiconductor die to the first semiconductor die using the adhesive (406). FIG. 3D1 depicts the structure of FIG. 3C1, but with the addition of a semiconductor die 314. Specifically, the semiconductor die 314 couples to the semiconductor die 308 using adhesive 312. The semiconductor die 314 may be properly positioned on the semiconductor die 308 using the die placement tool 310. FIG. 3D2 is a top-down view of the structure of FIG. 3D1.

The method 400 comprises coupling the first semiconductor die to a conductive terminal of the package using a first bond wire (408) and coupling the second semiconductor die to the first semiconductor die using a second bond wire (410). FIG. 3E1 depicts the use of a wedge bonding tool 318 to couple bond wires 316 from the semiconductor die 314 (e.g., an active surface of the semiconductor die 314) to the semiconductor die 308 (e.g., an active surface of the semiconductor die 308) and to couple bond wires 320 from the semiconductor die 308 (e.g., the active surface of the semiconductor die 308) to conductive terminals 302. In examples, the bond wires 316 have some or all of the same physical properties (e.g., composition, diameter, length, curvature, bond types, etc.) as those described above for the bond wires 140. FIG. 3E2 is a top-down view of the structure of FIG. 3E1, and FIG. 3E3 is a perspective view of the structure of FIG. 3E1.

The method 400 comprises causing the second semiconductor die to elevate above the first semiconductor die by removing the dissolvable adhesive (412). FIG. 3F1 depicts the structure of FIG. 3E1, but with the addition of a solvent 322 (e.g., toluene), which dissolves the adhesive 312. Removal of the adhesive 312 eliminates coupling between the semiconductor dies 308, 314, and the spring-like properties of the bond wires 316 cause the semiconductor die 314 to elevate above the semiconductor die 308. As a result, the semiconductor die 314 is suspended above the semiconductor die 308. FIG. 3F2 is a top-down view of the structure of FIG. 3F1. FIG. 3G1 depicts the structure of FIG. 3F1, but with the addition of a tool 324 (e.g., a tungsten probe) to optionally adjust a position (e.g., height) of the semiconductor die 314. FIG. 3G2 provides a top-down view of the structure of FIG. 3G1. FIG. 3H1 depicts the structure of FIG. 3G1 but with the solvent 322 removed and a die adjustment tool 328 being used to optionally further adjust the position of the semiconductor die 314. In some examples, a clearance 326 is at least 50 mils, which mitigates the chance of impact between the semiconductor die 314 and the semiconductor die 308 due to movement, jostling, etc. FIG. 3H2 is a top-down view of the structure of FIG. 3H1. FIG. 3H3 is a perspective view of the structure of FIG. 3H1.

The method 400 comprises covering the open cavity with a lid (414). FIG. 3I1 depicts the structure of FIG. 3H1, but with the addition of a lid 330 covering the open cavity 301. The lid 330 may be coupled to the package 300 using, e.g., a solder reflow process or any other suitable adhesive. For example, eutectic solder may be used. The resulting clearance 332 between the lid 330 and the semiconductor die 314 may be at least 50 mils to mitigate impact between the lid 330 and the semiconductor die 314 due to movement, jostling, etc. However, a smaller clearance such as 10 mils or larger may be used if a non-conductive ceramic lid 330 is implemented. FIG. 3I2 is a top-down view of the structure of FIG. 3I1. FIG. 3I3 is a perspective view of the structure of FIG. 3I1.

Figure 5:
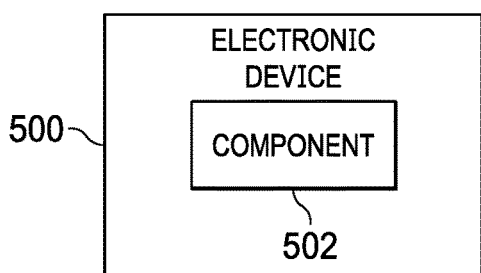
FIG. 5 is a schematic block diagram of an electronic device that includes a suspended semiconductor die, in accordance with various examples.

FIG. 5 is a schematic block diagram of an electronic device 500, such as a personal computer, server, smartphone, television, etc., that comprises a component 502 in accordance with various examples. The component 502 includes a suspended semiconductor die (not expressly shown). The component 502 may be a structure fabricated as depicted in FIGS. 1A1-1G3 and 2. The component 502 may be a structure fabricated as depicted in FIGS. 3A1-3I3 and 4.

In the foregoing discussion and in the claims, the terms "including" and "comprising" are used in an open-ended fashion, and thus mean "including, but not limited to . . . ." Also, the term "couple" or "couples" means either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means +/-10 percent of the stated value.

The above discussion is illustrative of the principles and various examples of the present disclosure. Numerous variations and modifications will become apparent to those skilled in the art once the above disclosure is fully appreciated. The following claims should be interpreted to embrace all such variations and modifications.

What is claimed is:

1. An electronic device, comprising:
a printed circuit board (PCB);
an orifice extending through the PCB; and
a semiconductor die suspended above the orifice by aluminum bond wires, the semiconductor die vertically aligned with the orifice and the bond wires coupled to the PCB.

2. The electronic device of claim 1, further comprising a cap coupled to the PCB and covering the semiconductor die.

3. The electronic device of claim 1, further comprising a cap coupled to a first surface of the PCB opposite a second surface of the PCB to which the aluminum bond wires couple, the cap covering the orifice.

4. The electronic device of claim 1, wherein the aluminum bond wires have diameters less than approximately 1 mil.

5. The electronic device of claim 1, wherein the aluminum bond wires have lengths ranging between approximately 100 mils and approximately 300 mils.

6. The electronic device of claim 1, wherein the semiconductor die is suspended at least 50 mils above the PCB.

7. The electronic device of claim 1, further comprising a first metal layer on a surface of the PCB to which the aluminum bond wires couple and a second metal layer positioned inside the PCB.

8. The electronic device of claim 1, wherein the aluminum bond wires couple to the PCB in a circular pattern.

9. The electronic device of claim 1, wherein the orifice is sealed.

10. The electronic device of claim 1, wherein the orifice is at least partially filled with a material that is different from a material of which the PCB is composed.

11. An electronic device, comprising:
a printed circuit board (PCB) having a first surface and a second surface opposing the first surface;
an orifice in the PCB extending from the first surface to the second surface;
a semiconductor die suspended above the first surface and vertically aligned with the orifice;
a first cap coupled to the first surface and covering the semiconductor die; and
a second cap coupled to the second surface and covering the orifice.

12. The electronic device of claim 11, wherein the first and second caps are metal caps or ceramic caps.

13. The electronic device of claim 11, further comprising:
a bond wire coupled to the semiconductor die;
a first metal layer on the first surface of the PCB that couples to the bond wire;
a first metal via in the PCB that couples to the first metal layer;
a second metal layer inside the PCB that couples to the first metal via;
a second metal via in the PCB that couples to the second metal layer; and
a third metal layer on the first surface of the PCB that couples to the second metal via.

14. The electronic device of claim 13, wherein the bond wire comprises aluminum.

15. The electronic device of claim 13, wherein the first cap contacts the surface of the PCB between the first and third metal layers.

16. The electronic device of claim 13, wherein the bond wire has a diameter of approximately 1 mil.

17. The electronic device of claim 13, wherein the bond wire has a Young's modulus between 69 GPa and 70 GPa.

18. The electronic device of claim 13, wherein the bond wire has a length of approximately 200 mils.

19. The electronic device of claim 11, wherein the semiconductor die is suspended at least 50 mils above the PCB.

20. The electronic device of claim 11, wherein the first and second caps contain an inert atmosphere.

21. The electronic device of claim 11, wherein the orifice is sealed.

22. The electronic device of claim 11, wherein the orifice is at least partially filled with a material that is different from a material of which the PCB is composed.

23. A semiconductor package, comprising:
- a conductive terminal exposed to an exterior surface of the semiconductor package;
- a first semiconductor die coupled to the conductive terminal by a first bond wire; and
- a second semiconductor die suspended above the first semiconductor die, the second semiconductor die coupled to the first semiconductor die by a second bond wire.

24. The semiconductor package of claim 23, wherein the second bond wire comprises aluminum.

25. The semiconductor package of claim 23, wherein the second bond wire has a diameter not exceeding approximately 1 mil.

* * * * *